(12) United States Patent
Teshima

(10) Patent No.: US 9,966,322 B2
(45) Date of Patent: May 8, 2018

(54) SEMICONDUCTOR DEVICE

(71) Applicant: Panasonic Intellectual Property Management Co., Ltd., Osaka (JP)

(72) Inventor: Hisao Teshima, Niigata (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/071,195

(22) Filed: Mar. 15, 2016

(65) Prior Publication Data
US 2016/0197023 A1 Jul. 7, 2016

Related U.S. Application Data

(63) Continuation of application No. PCT/JP2014/004927, filed on Sep. 26, 2014.

(30) Foreign Application Priority Data

Oct. 1, 2013 (JP) ................. 2013-206071

(51) Int. Cl.
*H01L 29/417* (2006.01)
*H01L 23/00* (2006.01)
(Continued)

(52) U.S. Cl.
CPC .......... *H01L 23/3192* (2013.01); *H01L 21/78* (2013.01); *H01L 23/3185* (2013.01);
(Continued)

(58) Field of Classification Search
CPC ........... H01L 29/7827; H01L 29/41766; H01L 24/05; H01L 23/528; H01L 23/3185
See application file for complete search history.

(56) References Cited

U.S. PATENT DOCUMENTS 4,249,299 A * 2/1981 Stephens ............. H01L 21/3043
257/738
9,793,230 B1 * 10/2017 Yu ........................... H01L 24/06
(Continued)

FOREIGN PATENT DOCUMENTS

JP 62-291129 A 12/1987
JP 2000-196117 7/2000
(Continued)

OTHER PUBLICATIONS

International Search Report of PCT application No. PCT/JP2014/004927 dated Jan. 6, 2015.

*Primary Examiner* — Jarrett Stark
*Assistant Examiner* — Charles N Ausar-El
(74) *Attorney, Agent, or Firm* — McDermott Will & Emery LLP

(57) ABSTRACT

A semiconductor device includes a semiconductor layer, a first conductor film, a second conductor film, and a first protective film. The semiconductor layer has a semiconductor element. The first conductor film is formed on an upper surface of the semiconductor layer and is electrically connected to the semiconductor element. The second conductor film is formed on an outer side surface of the semiconductor layer and is electrically connected to the semiconductor element. The first protective film is formed on the first conductor film and has an opening to expose the first conductor film. A height from the upper surface of the semiconductor layer to an upper surface of the second conductor film is equal to or smaller than a height from the upper surface of the semiconductor layer to an upper surface of the first conductor film.

20 Claims, 25 Drawing Sheets

(51) Int. Cl.
  H01L 23/528   (2006.01)
  H01L 23/31    (2006.01)
  H01L 29/78    (2006.01)
  H01L 21/78    (2006.01)
  H01L 29/861   (2006.01)
  H01L 29/732   (2006.01)
  H01L 29/74    (2006.01)
  H01L 29/739   (2006.01)

(52) U.S. Cl.
  CPC ............ *H01L 23/528* (2013.01); *H01L 24/02* (2013.01); *H01L 24/03* (2013.01); *H01L 24/05* (2013.01); *H01L 24/06* (2013.01); *H01L 24/13* (2013.01); *H01L 24/29* (2013.01); *H01L 24/94* (2013.01); *H01L 29/41741* (2013.01); *H01L 29/41766* (2013.01); *H01L 29/7396* (2013.01); *H01L 29/7397* (2013.01); *H01L 29/7809* (2013.01); *H01L 29/7813* (2013.01); *H01L 29/7827* (2013.01); *H01L 29/8611* (2013.01); H01L 24/16 (2013.01); H01L 24/32 (2013.01); H01L 29/41716 (2013.01); H01L 29/732 (2013.01); H01L 29/7398 (2013.01); H01L 29/74 (2013.01); H01L 2224/02371 (2013.01); H01L 2224/02381 (2013.01); H01L 2224/0345 (2013.01); H01L 2224/0346 (2013.01); H01L 2224/03452 (2013.01); H01L 2224/03464 (2013.01); H01L 2224/0401 (2013.01); H01L 2224/04026 (2013.01); H01L 2224/05001 (2013.01); H01L 2224/0518 (2013.01); H01L 2224/0568 (2013.01); H01L 2224/05111 (2013.01); H01L 2224/05113 (2013.01); H01L 2224/05116 (2013.01); H01L 2224/05124 (2013.01); H01L 2224/05139 (2013.01); H01L 2224/05144 (2013.01); H01L 2224/05147 (2013.01); H01L 2224/05155 (2013.01); H01L 2224/05157 (2013.01); H01L 2224/05164 (2013.01); H01L 2224/05166 (2013.01); H01L 2224/05169 (2013.01); H01L 2224/05171 (2013.01); H01L 2224/05172 (2013.01); H01L 2224/05184 (2013.01); H01L 2224/05551 (2013.01); H01L 2224/05552 (2013.01); H01L 2224/05555 (2013.01); H01L 2224/05567 (2013.01); H01L 2224/05613 (2013.01); H01L 2224/05624 (2013.01); H01L 2224/05639 (2013.01); H01L 2224/05644 (2013.01); H01L 2224/05655 (2013.01); H01L 2224/05657 (2013.01); H01L 2224/05664 (2013.01); H01L 2224/05666 (2013.01); H01L 2224/05669 (2013.01); H01L 2224/05671 (2013.01); H01L 2224/05684 (2013.01); H01L 2224/0603 (2013.01); H01L 2224/06051 (2013.01); H01L 2224/10145 (2013.01); H01L 2224/131 (2013.01); H01L 2224/133 (2013.01); H01L 2224/1329 (2013.01); H01L 2224/13111 (2013.01); H01L 2224/13113 (2013.01); H01L 2224/13116 (2013.01); H01L 2224/13139 (2013.01); H01L 2224/13144 (2013.01); H01L 2224/13147 (2013.01); H01L 2224/13324 (2013.01); H01L 2224/13339 (2013.01); H01L 2224/13344 (2013.01); H01L 2224/13347 (2013.01); H01L 2224/13355 (2013.01); H01L 2224/16105 (2013.01); H01L 2224/16225 (2013.01); H01L 2224/16227 (2013.01); H01L 2224/291 (2013.01); H01L 2224/293 (2013.01); H01L 2224/2929 (2013.01); H01L 2224/29111 (2013.01); H01L 2224/29113 (2013.01); H01L 2224/29116 (2013.01); H01L 2224/29139 (2013.01); H01L 2224/29144 (2013.01); H01L 2224/29147 (2013.01); H01L 2224/29324 (2013.01); H01L 2224/29339 (2013.01); H01L 2224/29344 (2013.01); H01L 2224/29347 (2013.01); H01L 2224/29355 (2013.01); H01L 2224/32105 (2013.01); H01L 2224/32227 (2013.01); H01L 2224/81143 (2013.01); H01L 2224/81192 (2013.01); H01L 2224/81447 (2013.01); H01L 2224/81815 (2013.01); H01L 2224/81907 (2013.01); H01L 2224/83143 (2013.01); H01L 2224/83192 (2013.01); H01L 2224/83447 (2013.01); H01L 2224/83815 (2013.01); H01L 2224/83907 (2013.01); H01L 2224/94 (2013.01); H01L 2924/1301 (2013.01); H01L 2924/1305 (2013.01); H01L 2924/1306 (2013.01); H01L 2924/13055 (2013.01); H01L 2924/13091 (2013.01); H01L 2924/35121 (2013.01); H01L 2924/3841 (2013.01)

(56) References Cited

U.S. PATENT DOCUMENTS

| | | | |
|---|---|---|---|
| 2002/0102804 | A1 | 8/2002 | Nagase et al. |
| 2003/0042618 | A1* | 3/2003 | Nose ............... H01L 22/32 257/778 |
| 2004/0188680 | A1 | 9/2004 | Nakajima et al. |
| 2004/0207049 | A1* | 10/2004 | Bauer ............... H01L 21/78 257/620 |
| 2005/0023658 | A1* | 2/2005 | Tabira ............ H01L 21/565 257/678 |
| 2005/0064630 | A1* | 3/2005 | Zacherl ........... H01L 21/56 438/118 |
| 2005/0116310 | A1 | 6/2005 | Nishi et al. |
| 2009/0039514 | A1* | 2/2009 | Jobetto ........... H01L 21/56 257/758 |
| 2009/0071710 | A1* | 3/2009 | Stelzl ............. H01L 23/3164 174/520 |
| 2010/0155962 | A1 | 6/2010 | Inoue et al. |
| 2012/0326293 | A1* | 12/2012 | Kobayashi ...... H01L 23/49805 257/690 |

FOREIGN PATENT DOCUMENTS

| | | |
|---|---|---|
| JP | 2002-305309 | 10/2002 |
| JP | 2005-136394 | 5/2005 |
| JP | 2009-224641 | 10/2009 |
| JP | 2010-129749 | 6/2010 |
| JP | 2013-041914 | 2/2013 |
| JP | 2013041914 A * | 2/2013 |

* cited by examiner

SEMICONDUCTOR DEVICE

RELATED APPLICATIONS

This application is a Continuation of International Application No. PCT/JP2014/004927, filed on Sep. 26, 2014, which in turn claims priority from Japanese Patent Application No. 2013-206071, filed on Oct. 1, 2013, the contents of all of which are incorporated herein by reference in their entireties.

BACKGROUND

1. Field of the Invention

The present disclosure relates to a semiconductor device.

2. Description of the Related Art

The semiconductor device is provided by singulating and packaging a semiconductor wafer, on which semiconductor elements are formed through processes such as diffusing and wiring, to be connected to an external circuit. A great number of such semiconductor devices are mounted in an electronic device.

In the semiconductor device, a structure in which a major current path is formed between an upper surface and a lower surface of the semiconductor element is used in the semiconductor element such as a metal oxide semiconductor field effect transistor (MOSFET) using a large current, a bipolar transistor, and a diode. The semiconductor device including the above semiconductor element is difficult to miniaturize after the device has been packaged. This is because an electric connection is made from each of the upper surface and the lower surface of the semiconductor element through die bonding and wire bonding, and the packaging needs to be a plastic type or ceramic type.

Meanwhile, Unexamined Japanese Patent Publication No. 2010-129749 discloses a wafer level chip size package (CSP) technique in which an electric connection is ensured by forming a penetration electrode and rewiring, during an assembly process on a wafer. CSP technique has received attention.

Furthermore, a rewiring technique disclosed in Unexamined Japanese Patent Publication No. 2009-224641 is an effective technique for miniaturizing the device. Thus, by a technique to form a side surface electrode as disclosed in the Unexamined Japanese Patent Publication No. 2009-224641, characteristics of the semiconductor element can be improved and an integration degree thereof can be improved due to a more cubical wiring structure.

SUMMARY

A semiconductor device in an aspect of the present disclosure includes a semiconductor layer, a first conductor film, a second conductor film, and a first protective film. The semiconductor layer has a semiconductor element. The first conductor film is formed on an upper surface of the semiconductor layer and is electrically connected to the semiconductor element. The second conductor film is formed on an outer side surface of the semiconductor layer and is electrically connected to the semiconductor element. The first protective film is formed on the first conductor film and has one or more openings to expose the first conductor film. Furthermore, a height from the upper surface of the semiconductor layer to an upper surface of the second conductor film is equal to or smaller than a height from the upper surface of the semiconductor layer to an upper surface of the first conductor film.

According to the semiconductor device in the aspect of the present disclosure, electric resistance is reduced and mechanical strength is enhanced at the same time, and face-down mounting can be readily performed.

DETAILED DESCRIPTION OF THE PREFERRED EMBODIMENTS

As for a semiconductor device disclosed in the Unexamined Japanese Patent Publication No. 2010-129749 regions for a through hole and the penetration electrode need to be ensured in a semiconductor substrate, and an external terminal region needs to be formed on an upper surface of the semiconductor substrate to be electrically connected to its lower surface. Thus, compared with the conventional plastic type semiconductor device or ceramic type semiconductor device, the upper surface of the semiconductor substrate is limited in view of a layout. There is a problem that a region of the semiconductor element having the major current path between the upper surface and the lower surface becomes small. As a result, electric resistance in using a circuit is difficult to reduce with respect to an area of the semiconductor substrate, which limits a design of the semiconductor device.

Furthermore, as for the conventional wafer level CSP, since a portion such as the side surface of the semiconductor device is exposed, there is a problem that it is vulnerable to mechanical outer force.

Furthermore, as for a semiconductor device disclosed in the Unexamined Japanese Patent Publication No. 2009-224641, a lower surface electrode is connected to a lead frame with a solder. When the technique in the Unexamined Japanese Patent Publication No. 2009-224641 is used for the face-down mounting which does not use the lead frame, a height from a substrate to an upper surface of an upper surface electrode is smaller than a height from the substrate to an upper surface of a side surface electrode, which causes a connection defect in the upper surface electrode.

In view of the above, the present disclosure provides a semiconductor device which can reduce electric resistance, enhance mechanical strength, and be readily face-down mounted.

Hereinafter, exemplary embodiments of the present disclosure will be described with reference to the drawings. However, a detailed description for a well-known technique, and a duplicated description for substantially the same component are skipped occasionally. The present disclosure is not limited to the following exemplary embodiments, and a plurality of exemplary embodiments may be combined, or an equivalent component may be replaced without departing from the scope of the technique of the present disclosure.

First Exemplary Embodiment

Hereinafter, a semiconductor device in the first exemplary embodiment will be described with reference to FIGS. 1A to 3E.

Figure 1A:
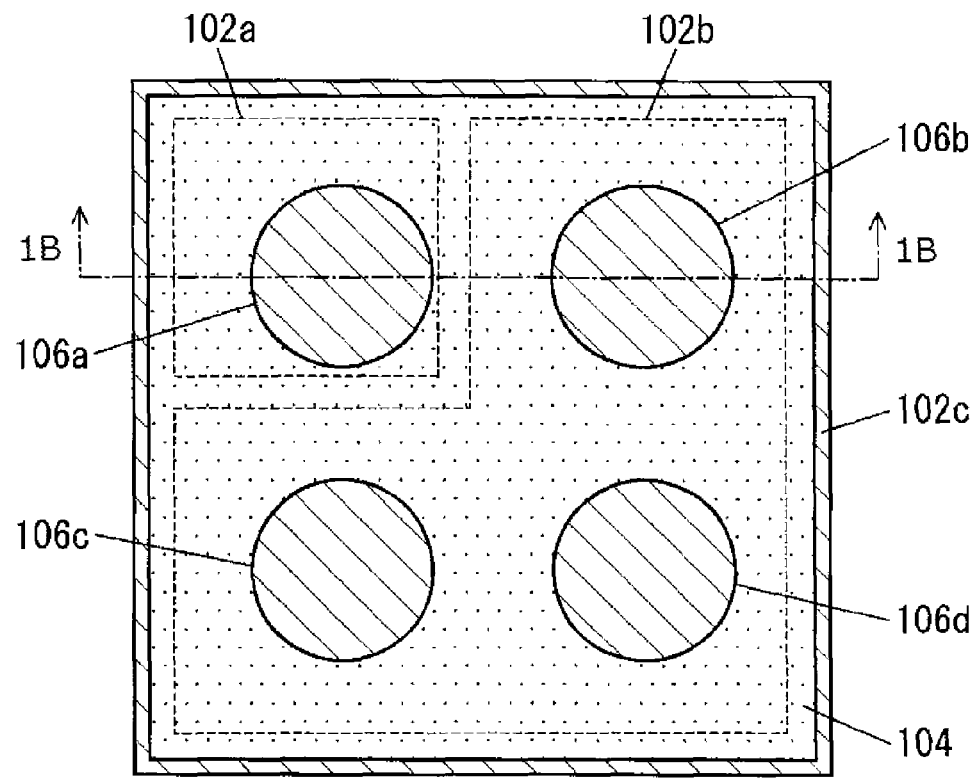
FIG. 1A is a plan view of a semiconductor device in a first exemplary embodiment.

FIG. 1A shows an upper surface of the semiconductor device in this exemplary embodiment. The semiconductor device includes conductor films 102a, 102b, and 102c. Conductor film 102c serves as a side surface of the semiconductor device. Conductor film 102a and conductor film 102b are covered with protective film 104 such as a silicon nitride film. Conductor films 102a and 102b under protective film 104 each have planar shapes shown by broken lines in FIG. 1A.

In this specification, "upper surface" means a surface to be bonded to a mounting substrate at the time of mounting, and "lower surface" means a surface opposite the "upper surface" unless otherwise noted. In addition, "side surface" means a surface other than the "upper surface" and the "lower surface", and "outer side surface" means "side surface" disposed at outer periphery.

A plurality of openings are provided in protective film 104, and conductor films 102a and 102b are exposed at the openings. Each of the conductor films 102a and 102b exposed at the openings serves as an external terminal. As shown in FIG. 1A, one opening 106a is formed in protect film 104 for conductor film 102a, and three openings 106b, 106c, and 106d are formed in protective film 104 for conductor film 102b. The side surface of the semiconductor device is formed of conductor film 102c which serves as the external terminal. In this specification, "external terminal" of the semiconductor device means a terminal to be connected to the mounting substrate, such as a gate terminal, a source terminal, or a drain terminal.

Figure 1B:
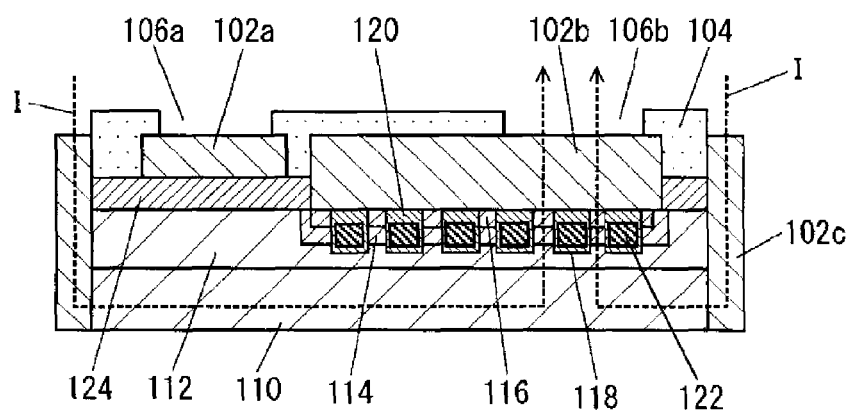
FIG. 1B is a cross-sectional view taken along line 1B-1B in FIG. 1A.

FIG. 1B is a cross-sectional view taken along line 1B-1B in FIG. 1A. FIG. 1B shows a case where the semiconductor device is a field effect transistor (FET). The semiconductor device includes first conductivity type semiconductor layer 110, first conductivity type semiconductor layer 112 disposed on semiconductor layer 110, second conductivity type semiconductor portion 114 formed in a region at an upper surface side of semiconductor layer 112, and first conductivity type semiconductor portion 116 formed in a region at an upper surface side of semiconductor portion 114. Semiconductor layer 112 and semiconductor portion 114 are composed of, for example, Si. Semiconductor portion 114 and semiconductor portion 116 are formed by a method such as ion implantation.

The semiconductor device includes groove 118 which penetrates semiconductor portion 114 and semiconductor portion 116 to reach semiconductor layer 112. Gate electrode 122 is disposed in groove 118 with interposing gate oxide film 120 composed of, for example, $SiO_2$. Gate electrode 122 is composed of, for example, polysilicon.

A semiconductor element in the semiconductor device is a so-called vertical MOSFET. That is, semiconductor layer 110 serves as a drain region, semiconductor portion 114 serves as a body region, semiconductor layer 112 serves as a drift region, and semiconductor portion 116 serves as a source region.

Insulating film 124 is disposed on a part of the upper surface of semiconductor layer 112, and conductor film 102a as the gate terminal is disposed on insulating film 124. Conductor film 102a is electrically connected to gate electrode 122.

Conductor film 102b as the source terminal is disposed on the semiconductor layer 112 which is not covered with insulating film 124. Conductor film 102b is electrically connected to semiconductor portion 116 serving as the source region. Furthermore, conductor film 102b is electrically connected to semiconductor portion 114 serving as the body region.

Conductor film 102c serving as the drain terminal is formed around the side surfaces of semiconductor layer 110 and the side surfaces of semiconductor layer 112. Conductor film 102c is electrically connected to semiconductor layer 110 serving as the drain region. Since conductor film 102c is formed on the side surface of the semiconductor device, the semiconductor device is protected by conductor film 102c. Thus, mechanical strength of the semiconductor device is increased. Furthermore, since the drain terminal is formed in the region other than the upper surface of the semiconductor layer, other regions for the semiconductor element can be provided in the semiconductor layer and on the upper surface of the semiconductor layer. Therefore, compared with a conventional semiconductor element having the same size, an area for the semiconductor element can be substantially increased, so that electric resistance in using a circuit can be readily reduced.

A height from the upper surface of semiconductor layer 112 to an upper surface of conductor film 102c is equal to or smaller than a height from the upper surface of semiconductor layer 112 to upper surfaces of conductor film 102a and conductor film 102b. In this structure, a connection defect is not likely to occur in conductor film 102a and conductor film 102b, so that face-down mounting to the mounting substrate can be readily performed.

Furthermore, it is preferable that the upper surface of conductor film 102a, the upper surface of conductor film 102b, and the upper surface of conductor film 102c are flush with one another. In this structure, the semiconductor device can become readily parallel to the mounting substrate, so that the face-down mounting to the mounting substrate can be readily performed. In this specification, meaning of "flush" includes "substantially flush" including a manufacturing error.

Hereinafter, the semiconductor device in FIG. 1B will be described as a Nch FET in which the first conductivity type is an N type and the second conductivity type is a P type.

A voltage is applied between conductor film 102c (drain terminal) and conductor film 102b (source terminal), and between conductor film 102a (gate terminal) and conductor film 102b. At this time, conductor film 102a and conductor film 102c become electrically positive, and a channel is formed in semiconductor portion 114 (body region). When the voltage is applied, circuit current I flows from conductor film 102c to conductor film 102b through a path of conductor film 102c, semiconductor layer 110 (mainly drain region), semiconductor layer 112, semiconductor portion 114, semiconductor portion 116, and conductor film 102b.

Furthermore, each region in the path of circuit current I preferably has as low electrical resistance as possible in order to prevent heat generation. For example, conductor film 102c provided in the path of circuit current I is preferably thick in a direction vertical to the side surfaces of semiconductor layer 110 and semiconductor layer 112. More specifically, the thickness is preferably between $10^{-1}$ μm and $10^2$ μm (inclusive). Furthermore, a thickness of semiconductor layer 110 is preferably between 50 μm and 200 μm (inclusive) to reduce the electrical resistance.

Hereinafter, a description will be given to a configuration in which the semiconductor device is face-down mounted on mounting substrate 130.

Figure 1C:
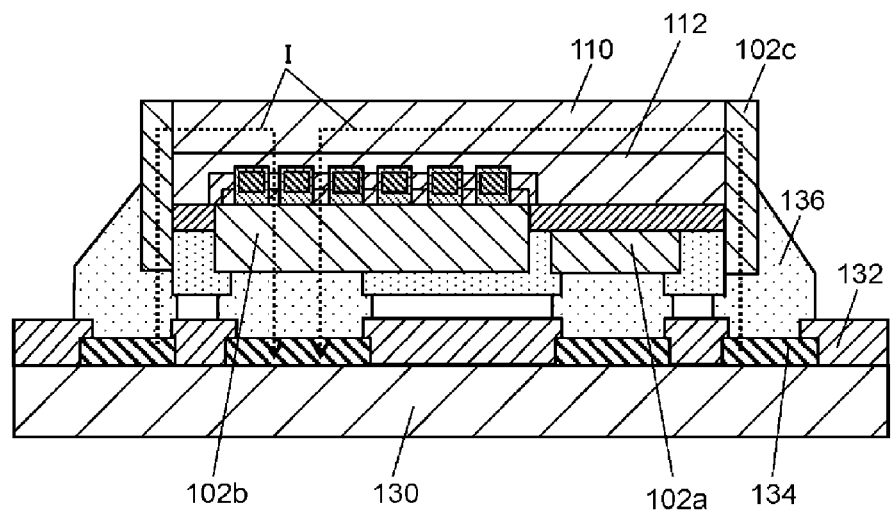
FIG. 1C is a cross-sectional view of the semiconductor device in the first exemplary embodiment mounted on a mounting substrate.

FIG. 1C is a cross-sectional view of the semiconductor device mounted on mounting substrate 130 taken along the same position as line 1B-1B in FIG. 1A. As shown in FIG. 1C, each of conductor film 102b, conductor film 102a, and conductor film 102c of the semiconductor device are electrically and mechanically connected to substrate pad 134 disposed on mounting substrate 130 through connection material 136. Conductor film 102a serves as the gate terminal, conductor film 102b serves as the source terminal, and conductor film 102c serves as the drain terminal. Substrate pad 134 is disposed on mounting substrate 130, and exposed at an opening of substrate coating material 132. Substrate coating material 132 is composed of an insulator, and substrate pad 134 is composed of, for example, Cu. Furthermore, in a case where mounting substrate 130 is a flexible substrate, reliability after the mounting is improved compared with the conventional semiconductor device.

As described above, the height from the upper surface of semiconductor layer 112 to the upper surface of substrate 102c is equal to or smaller than the height from the upper surface of semiconductor layer 112 to the upper surfaces of conductor film 102a and the conductor film 102b. In this structure, a contact defect is hardly generated between conductor film 102a and substrate pad 134, and conductor film 102b and substrate pad 134. On the other hand, as for conductor film 102c, connection material 136 extends upward along the side surface of conductor film 102c, so that a connection defect does not occur. As a result, the semiconductor device can be readily face-down mounted on the mounting substrate. In addition, although it is not shown, a plurality of recesses may be provided in conductor film 102c so as to be disposed apart from each other. In this configuration, a contact area between connection material 136 and conductor film 102c is increased, so that bonding strength and mounting strength are enhanced. Furthermore, a depth and a width of the recess are not limited in particular as long as the mounting can be performed properly.

In a case where thermal expansion coefficients of semiconductor layer 110 and semiconductor layer 112 are different from a thermal expansion coefficient of conductor film 102c, peeling of conductor film 102c could be generated. This is because due to a change in environmental temperature in a process a counting process, the semiconductor device receives a stress between semiconductor layer 110 and conductor film 102c, and semiconductor layer 112 and conductor film 102c. In order to disperse the stress which causes the peeling, conductor film 102c is to be tightly disposed on the side surfaces of semiconductor layers 110 and 112 without leaving any defects such as breaks, for example.

Each conductor film may be made of metal, polysilicon having high impurity concentration, or conductive paste.

Each conductor film may be a single-layer film composed of alloy, a single-layer film composed of pure element of metal element or semi-metal element, a laminated-layer film composed of alloy, a laminated-layer film composed of pure element of metal element or semi-metal element, or a laminated-layer film composed of alloy and pure element. Examples of the metal element to be used include Ti, W, Al, Cr, Mo, Au, Pt, Ag, Cu, Ni, Co, Pd, Sn, Pb, Bi, and V. Examples of the semi-metal element to be used include Sb, As, B, Si, and Ge. Furthermore, examples of an additive to be used include a non-metal element such as P, C, N, or H. Among them, Au, Ag, Pd, or Bi is preferably used as a surface layer of each conductor film because it has a preferable wettability with the connection material such as solder, in general.

Connection material 136 may be a solder material selected from PbSn, AuSn, CuSN, AgSn, BiSn, AuSi, AuGe, and AuSb. However, another material may be used instead of the solder material as long as the mechanical strength and the electric resistance can satisfy required specifications after the mounting. For example, the material may be a conductive paste, a conductive resin, or brazing material composed of a mixture of metal such as Ag, Cu, Au, Ni or Al with an organic material.

As shown in FIG. 1A, an area of conductor film 102a exposed at opening 106a (hereinafter, referred to as opening areas) is preferably equal to an area of conductor film 102b exposed at each of openings 106b to 106d in protective film 104.

In the face-down mounting, connection material 136 is printed on substrate pad 134 of mounting substrate 130 with a screen mask, for example. After that, the semiconductor device is disposed on uncured connection material 136 in a face-down state and temporarily fixed thereon. After that, connection material 136 is melted in a reflow process to bond mounting substrate 130 to the semiconductor device.

In this way, by equalizing each area of openings 106a to 106d, a height of connection material 136 provided in each opening, from an upper surface of substrate pad 134 is almost at the same level after the reflow process, so that the semiconductor device is prevented from being tilted after it is mounted, and a mounting defect is not likely to occur. Furthermore, a total area of the upper surface of conductor film 102c may be equal to each opening area.

Perimeters of openings 106a to 106d provided in protective film 104 are preferably equal to each other. A surface tension is generated when connection material 136 is melted, so that connection material 136 tilts at an edge of the opening. Thus, a degree of the surface tension depends on the perimeter of the opening, so that an angle of the tilt also depends on the perimeter of the opening. Therefore, when the perimeter of the opening is equal, the angle of the tilt can be also equal, so that the mounting defect can be prevented from occurring.

When the opening area is equal and the perimeter is equal in each opening, the height of connection material 136 from the upper surface of substrate pad 134 can be the same with high accuracy at the time of mount so that the mounting defect can be reduced.

Variation 1 of First Exemplary Embodiment

Figure 1D:
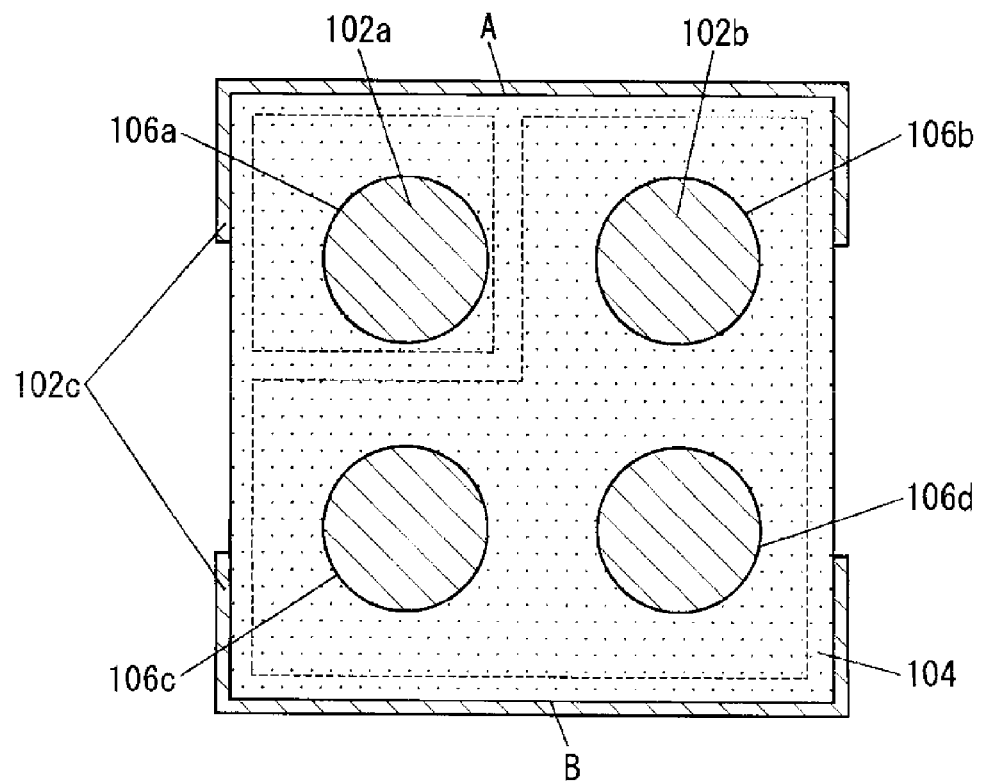
FIG. 1D is a plan view of a semiconductor device in variation 1 of the first exemplary embodiment.

Hereinafter, a semiconductor device in variation 1 in the first exemplary embodiment will be described with reference to FIG. 1D.

The semiconductor device in variation 1 differs from the semiconductor device shown in FIGS. 1A and 1B, in a configuration of conductor film 102c. Conductor film 102c is partially formed on a side surface of the semiconductor device. More specifically, conductor film 102c is at least formed on side surface A of lower semiconductor layers (semiconductor layers 110 and 112) and side surface B opposite side surface A. Conductor film 102c may be partially formed on each of two other side surfaces intersecting with side surface A and side surface B. In other words, the semiconductor device may have a pair of side surfaces covered with conductor film 102c and a pair of side surfaces partially not covered with conductor film 102c. Surface tension of melted connection material 136 in the reflow process pulls conductor film 102c having a preferable wettability. When conductor film 102c is disposed only on the opposite surfaces, the semiconductor device can be prevented from being displaced when it is temporarily fixed to mounting substrate 130 by use of the surface tension of connection material 136. Thus, a mounting defect can be prevented.

Furthermore, conductor film 102c may be partially formed on the side surface, and the side surface may have a portion not covered with conductor film 102c. Through the portion not covered with conductor film 102c, a wiring of the mounting substrate can be withdrawn to be connected to conductor films 102a and 102b, so that this configuration is especially useful when the mounting substrate is a single-layer wiring substrate. Furthermore, by appropriately setting the position of conductor film 102c, a thick wiring can be withdrawn from the mounting substrate, so that ON-resistance can be readily reduced.

Variation 2 of First Exemplary Embodiment

Figure 1E:
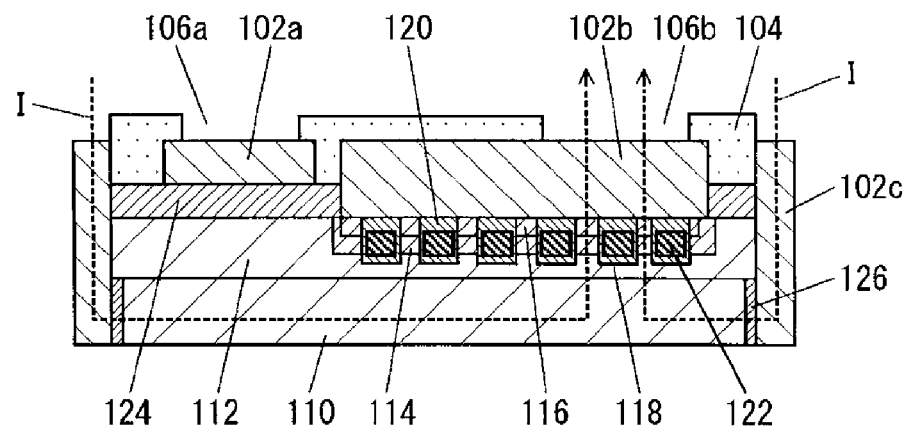
FIG. 1E is a cross-sectional view of a semiconductor device in variation 2 of the first exemplary embodiment.

Hereinafter, a semiconductor device in variation 2 of the first exemplary embodiment will be described with reference to FIG. 1E.

The semiconductor device in variation 2 differs from the semiconductor device shown inn FIGS. 1A and 1B in a configuration that contact region 126 having lower resistance than semiconductor layer 110 is formed between semiconductor layer 110 and conductor film 102c.

In this variation, in a case where a conductivity type of semiconductor layer 110 is the N type, an impurity concentration of contact region 126 is preferably $1 \times 10^{20}$ [cm$^3$] or more. In a case where the conductivity type of semiconductor layer 110 is the P type, the concentration of contact region 126 is preferably $1 \times 10^{19}$ [/cm$^3$] or more.

In a case where conductor film 102c is made of Mo, Cr, Ti, W, Ni, Au, Pt, Al, or Co by an electron beam (EB) vapor deposition method which is included in a physical vapor deposition (PVD) method, contact region 126 is naturally formed in semiconductor layer 110. In the EB vapor deposition method, a material is evaporated and dispersed, so that the material reaches semiconductor layer 110 with thermal energy maintained. Thus, the material of conductor film 102c reacts with a material of the semiconductor layer, whereby contact region 126 is formed.

Contact region 126 can be provided by forming a silicide layer by a sputtering method which is included in the PVD method or chemical vapor deposition (CVD) method and performing a heat treatment, or by forming a silicide layer by a sputtering method. Furthermore, contact region 126 may be formed by additionally doping an impurity to semiconductor layer 110, or dispersing an impurity. In addition, when a heat treatment is performed after the impurity is doped, to activate the impurity, the resistance of contact region 126 can be further lowered.

Furthermore, instead of forming contact region 126, semiconductor layer 110 may be roughened in a contact surface with conductor film 102c. That is, an area of the contact surface is increased, so that contact resistance can be lowered.

In this configuration, electric resistance can be reduced between semiconductor layer 110 and conductor film 102c, so that the semiconductor device can be miniaturized.

Other Variations of First Exemplary Embodiment

The description has been given to the Nch FET as the semiconductor element in the first exemplary embodiment and variations 1 and 2, but the same effect can be provided in a Pch FET. Furthermore, the same effect can be provided in a diode shown in FIG. 2A, a bipolar transistor shown in FIG. 2C, a thyristor shown in FIG. 2D, and insulated gate bipolar transistor (IGBT) shown in FIG. 2E as well as the FET.

Figure 2A:
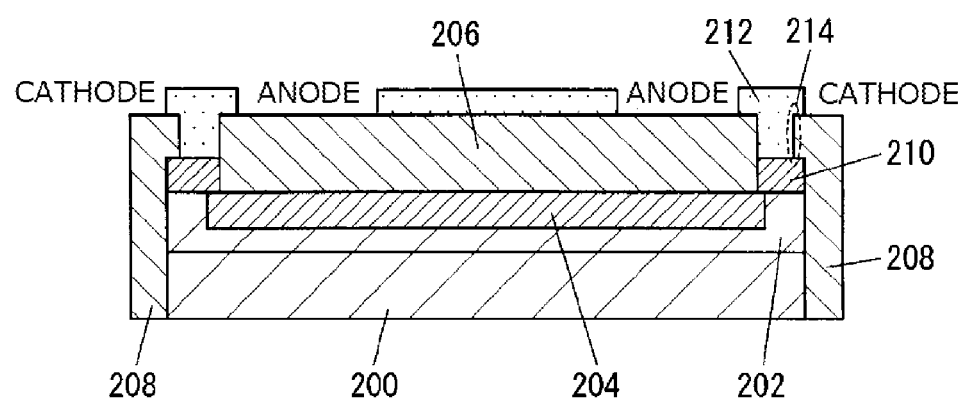
FIG. 2A is a cross-sectional view of a semiconductor device in another variation of the first exemplary embodiment.

The diode shown in FIG. 2A includes N-type semiconductor layer 200, N-type semiconductor layer 202 formed on semiconductor layer 200, P-type semiconductor portion 204 formed in semiconductor layer 202, and conductor film 206 formed on semiconductor portion 204. Insulating film 210 is formed on semiconductor layer 202 to insulate the conductor films from each other. Conductor film 206 is exposed at an opening in protective film 212.

Figure 2B:
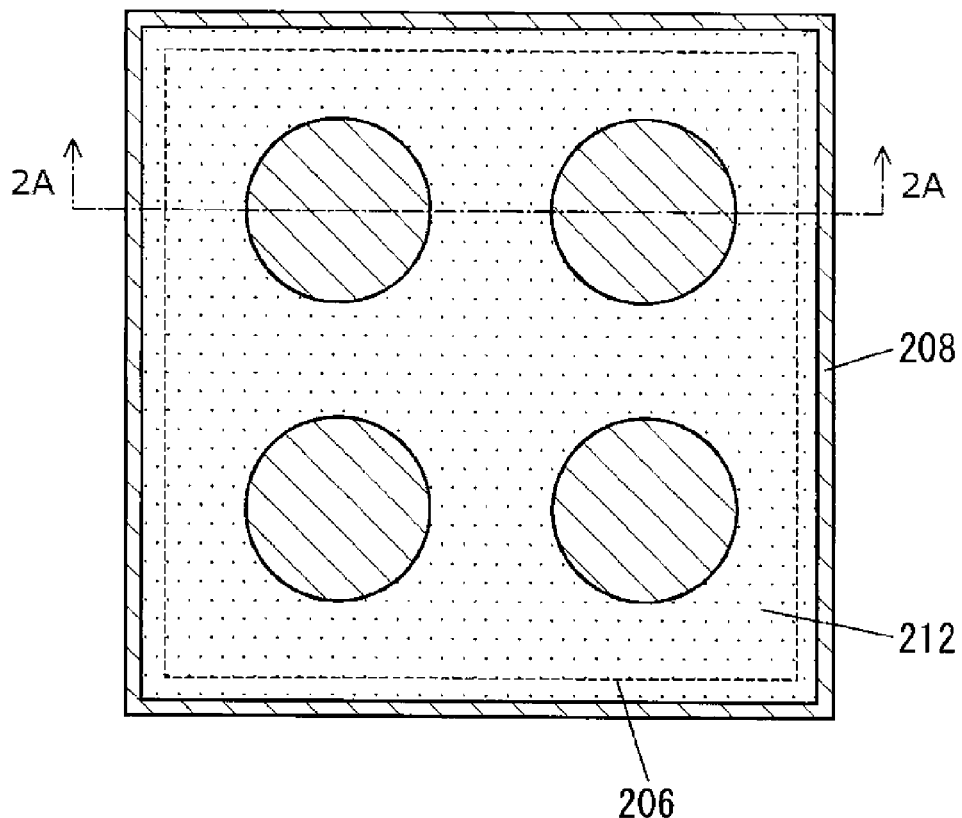
FIG. 2B is a plan view of the semiconductor device in FIG. 2A.

Conductor film 206 serves as an anode region, and conductor film 208 serves as a cathode region. An impurity concentration of semiconductor layer 200 is higher than an impurity concentration of semiconductor layer 202. FIG. 2B is a plan view of the diode shown in FIG. 2A, in which four openings are formed for conductor film 206.

Conductor film 208 serves as a side surface of the semiconductor device and electrically connected to semiconductor layer 200 and semiconductor layer 202. Furthermore, in a case where semiconductor layer 200 and semiconductor layer 202 are the P type, and semiconductor portion 204 is the N-type, the anode region and the cathode region are exchanged.

Conductor film 208 may cover insulating film 210. That is, conductor film 208 may cover an intersection of an upper surface and a side surface of the semiconductor layer. In this case, end 214, provided on insulating film 210, of conductor film 208 is preferably covered with protective film 212.

In this structure, end 214 in which a stress is likely to be concentrated is covered with protective film 212, conductor film 208 can be prevented from being peeled from insulating film 210, semiconductor layer 202, and semiconductor layer 200. This structure can be applied to the semiconductor device shown in FIG. 1B.

Figure 2C:
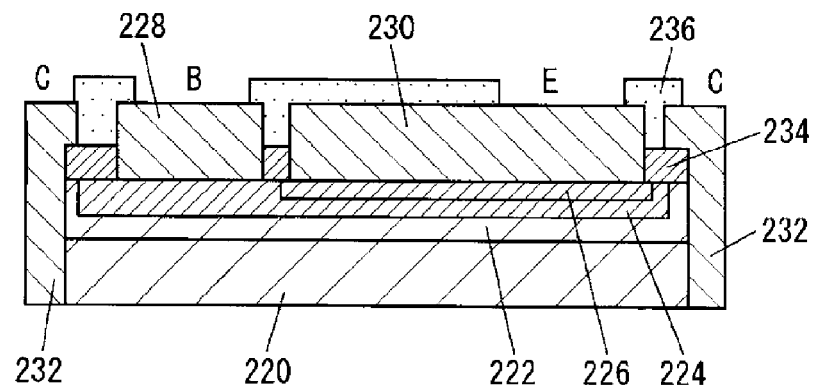
FIG. 2C is a cross-sectional view of a semiconductor device in another variation of the first exemplary embodiment.

The bipolar transistor shown in FIG. 2C includes N-type semiconductor layer 220, N-type semiconductor layer 222 formed on semiconductor layer 220, P-type semiconductor portion 224 formed in semiconductor layer 222, and N-type semiconductor portion 226 formed in semiconductor portion 224.

Conductor film 228 electrically connected to semiconductor portion 224 serves as a base region, and conductor film 230 electrically connected to semiconductor portion 226 serves as an emitter region. Conductor film 232 serves as a collector region. Conductor films are insulated from each other by insulating film 234. Conductor film 228 and conductor film 230 are exposed at openings provided in protective film 236 and serve as external terminals. In addition, a plan view showing the conductor film and the protective film in the bipolar transistor in FIG. 2C is substantially the same as that shown in FIG. 1A.

Figure 2D:
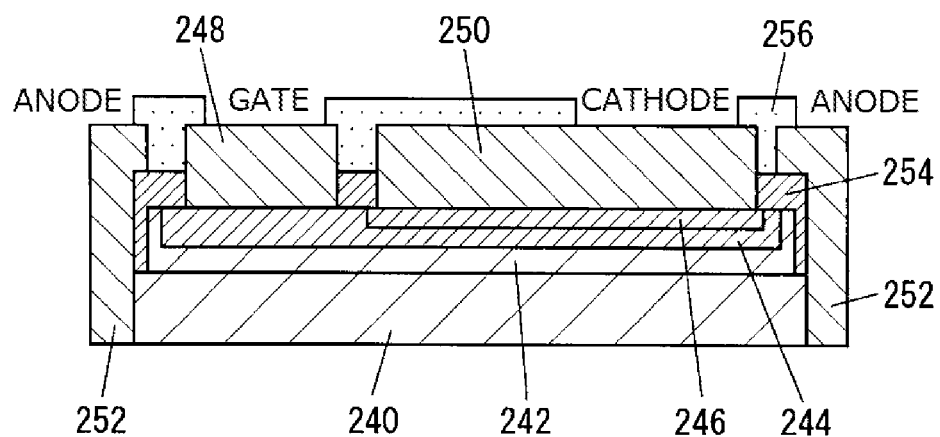
FIG. 2D is a cross-sectional view of a semiconductor device in another variation of the first exemplary embodiment.

The thyristor shown in FIG. 2D includes P-type semiconductor layer 240. N-type semiconductor layer 242 formed on semiconductor layer 240, P-type semiconductor portion 244 formed in semiconductor layer 242, and N-type semiconductor portion 246 formed in semiconductor portion 244. Conductor films are insulated from each other by insulating film 254. Conductor film 248 and conductor film 250 are exposed at openings provided in protective film 256 and serve as external terminals.

Conductor film 252 is electrically connected to semiconductor layer 240 and serves as an anode region which is an external terminal. Conductor film 248 electrically connected to semiconductor portion 244 serves as a gate terminal. Conductor film 250 electrically connected to semiconductor portion 246 serves as a cathode region. Furthermore, in a case where semiconductor layer 240 and semiconductor portion 244 are the N type, and semiconductor layer 242 and semiconductor portion 246 are the P type, the anode region and the cathode region are exchanged. In addition, a plan view of the conductor film and the protective film of the thyristor shown in FIG. 2D is substantially the same as that shown in FIG. 1A.

Figure 2E:
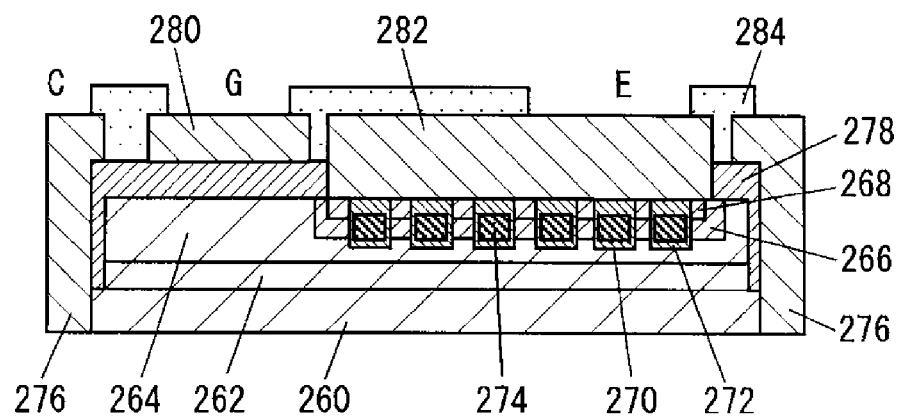
FIG. 2E is a cross-sectional view of a semiconductor device in another variation of the first exemplary embodiment.

The IGBT shown in FIG. 2E includes P-type semiconductor layer 260, N-type semiconductor layer 262 formed on semiconductor layer 260, N-type semiconductor layer 264 formed on semiconductor layer 262, P-type semiconductor portion 266 formed in semiconductor layer 264, and N-type semiconductor portion 268 formed in semiconductor portion 266. Gate oxide film 272 is disposed in groove 270 which is formed so as to penetrate semiconductor portion 268 and semiconductor portion 266 to reach semiconductor layer 264. Gate electrode 274 is disposed in gate oxide film 272. Conductor film 280 and conductor film 282 are exposed at openings formed in protective film 284 and serve as external terminals.

Conductor film 276 is electrically connected to semiconductor layer 260 and serves as a collector, and semiconductor layer 262 and semiconductor layer 264 are insulated by insulating film 278. Conductor film 280 insulated from semiconductor layer 264 by insulating film 278 is electrically connected to gate electrode 274 to serve as a gate terminal. Conductor film 282 electrically connected to semiconductor portion 268 serves as an emitter. Conductor film 280 is insulated from conductor film 276 by insulating film 278, and conductor film 282 is insulated from conductor film 276 by insulating film 278. Note that, a plan view of the conductor film and the protective film of the IGBT shown in FIG. 2E is substantially the same as that shown in FIG. 1A.

Manufacturing Method

Hereinafter, a method for manufacturing the semiconductor device in the first exemplary embodiment in the present disclosure will be described with reference to cross-sectional views shown in FIGS. 3A to 3F.

Figure 3A:
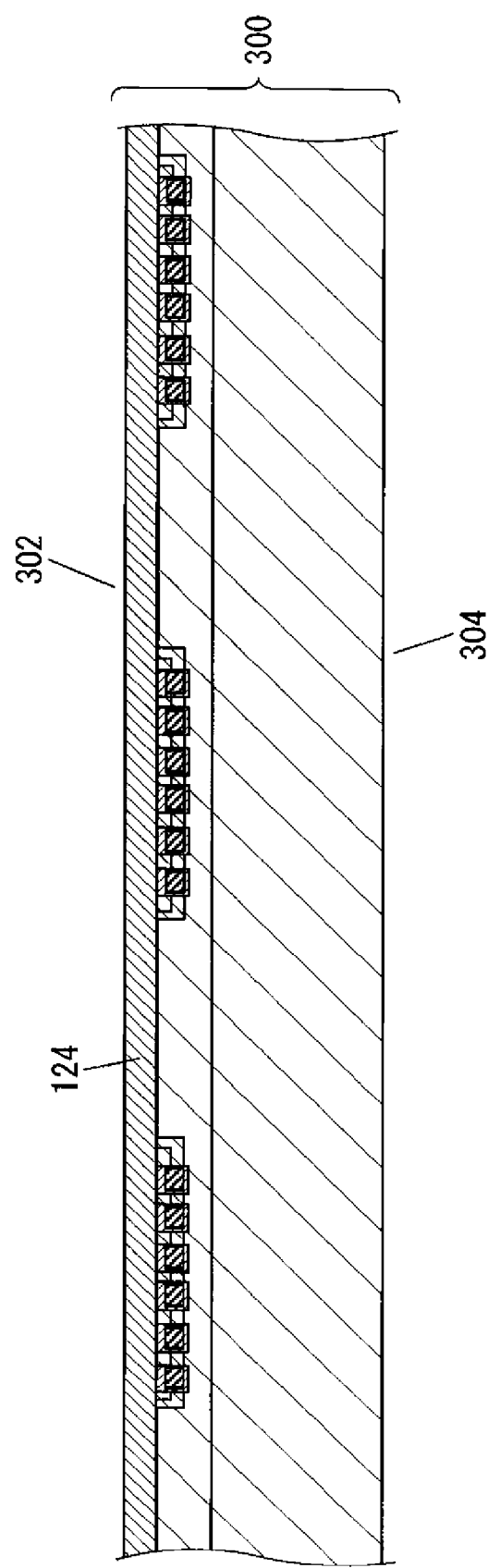
FIG. 3A is a cross-sectional view showing a step in a method for manufacturing the semiconductor device in the exemplary embodiment.

First, as shown in FIG. 3A, a semiconductor element such as FET is formed in wafer-like semiconductor substrate 300. Wafer-like semiconductor substrate 300 has upper surface 302, and lower surface 304 opposite upper surface 302.

Figure 3B:
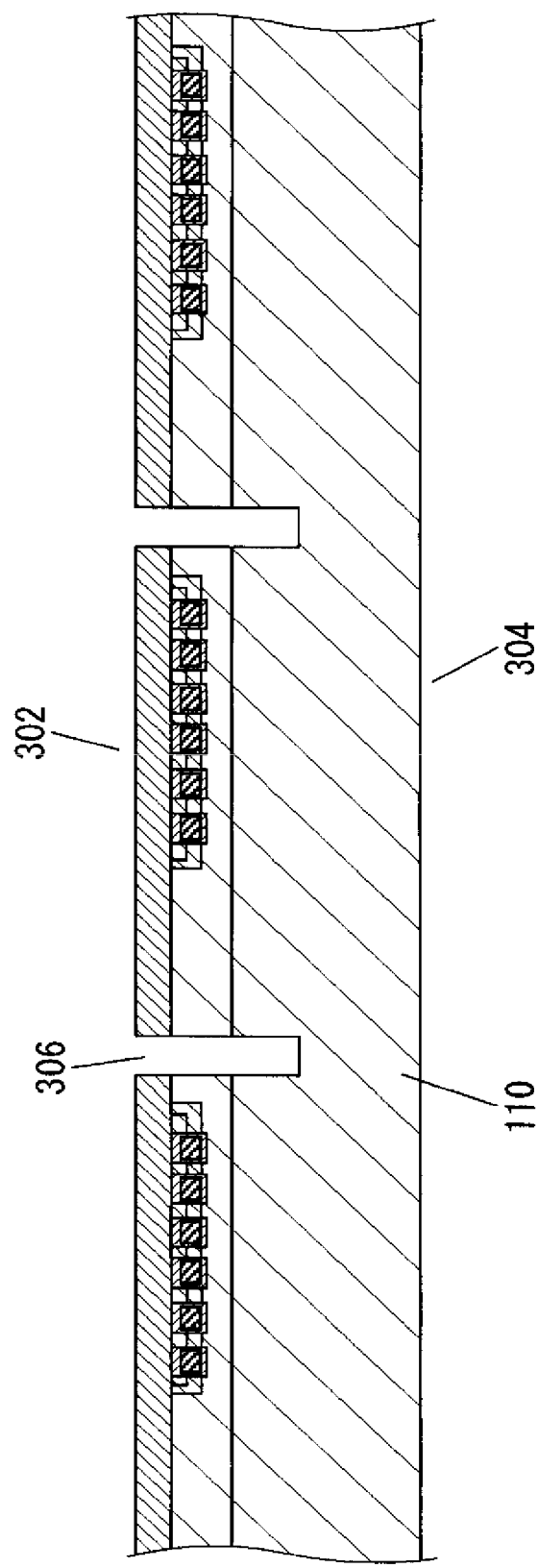
FIG. 3B is a cross-sectional view showing a step in the method for manufacturing the semiconductor device in the first exemplary embodiment.

Subsequently, as shown in FIG. 3B, groove 306 is formed from upper surface 302 to semiconductor layer 110 along an outer shape of the FET. Groove 306 may be formed by blade dicing or laser dicing.

Groove 306 may be formed by dry etching with a photoresist or hard mask. In this case, the semiconductor device can be prevented from being damaged by dicing. In addition, since the process can be conducted on whole upper surface 302 of wafer-like semiconductor substrate 300, groove 306 can be formed in a short time. Furthermore, groove 306 may be formed by wet etching with a mask such as photoresist, silicon oxide film mask, or metal mask.

Figure 3C:
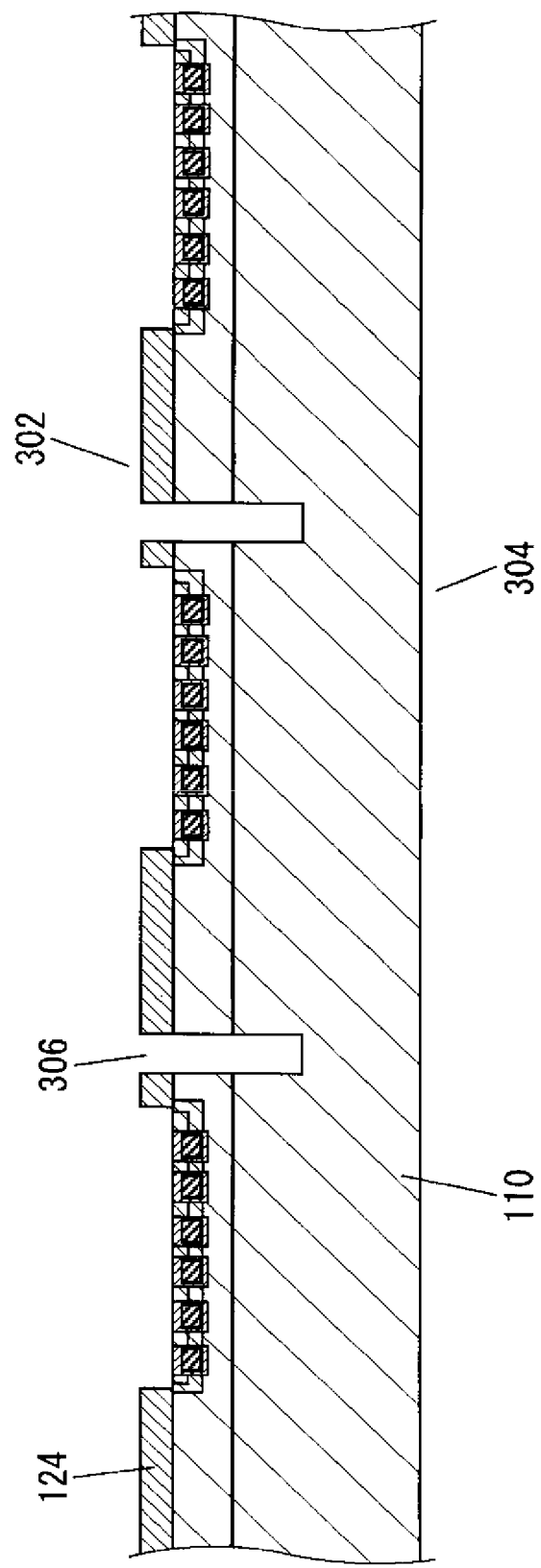
FIG. 3C is a cross-sectional view showing a step in the method for manufacturing the semiconductor device in the first exemplary embodiment.

Subsequently, as shown in FIG. 3C, an opening of insulating film 124 is formed in upper surface 302 to form conductor film 102b. The opening may be formed by partially etching insulating film 124 with a mask such as photoresist.

Figure 3D:
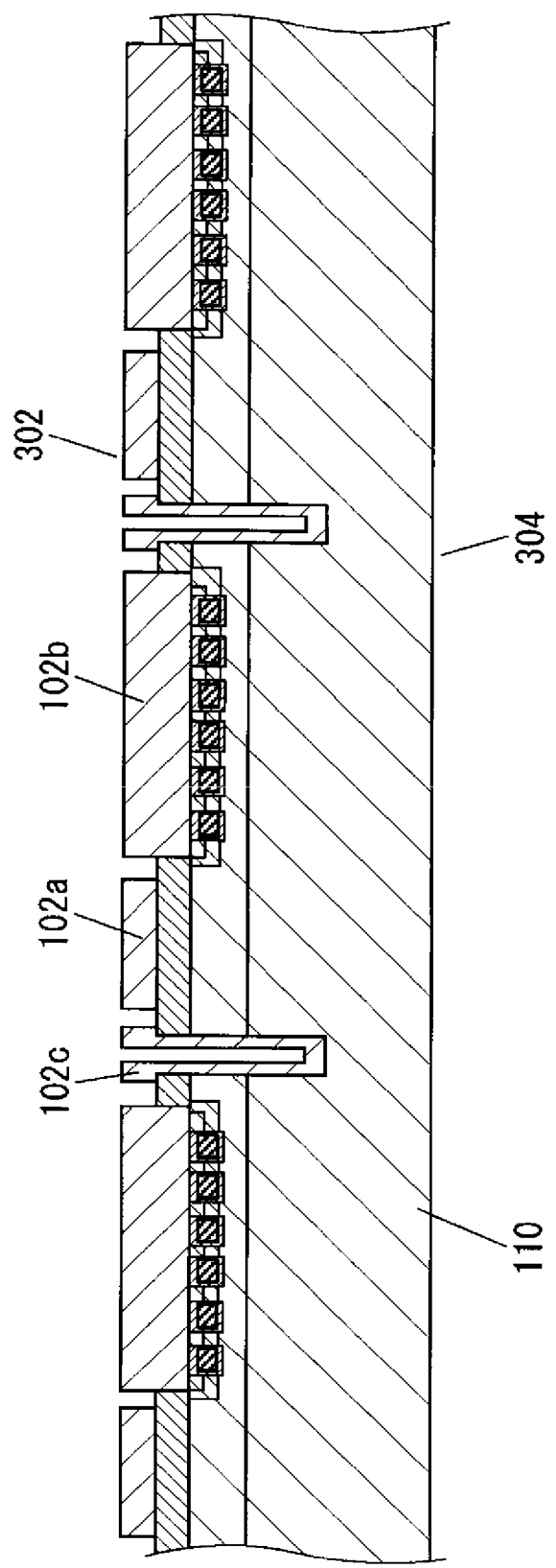
FIG. 3D is a cross-sectional view showing a step in the method for manufacturing the semiconductor device in the first exemplary embodiment.

Subsequently, as shown in FIG. 3D, conductor film 102a is formed on insulating film 124, conductor film 102b is formed in the opening, and conductor film 102c is formed in groove 306. The conductor film is preferably formed by a CVD method. For example, when a CVD film made of Ti or W is used, conductor film 102c can be readily thickened, so that electric resistance of conductor film 102c can be reduced. Conductor film 102c may be formed by a plating method.

Figure 3E:
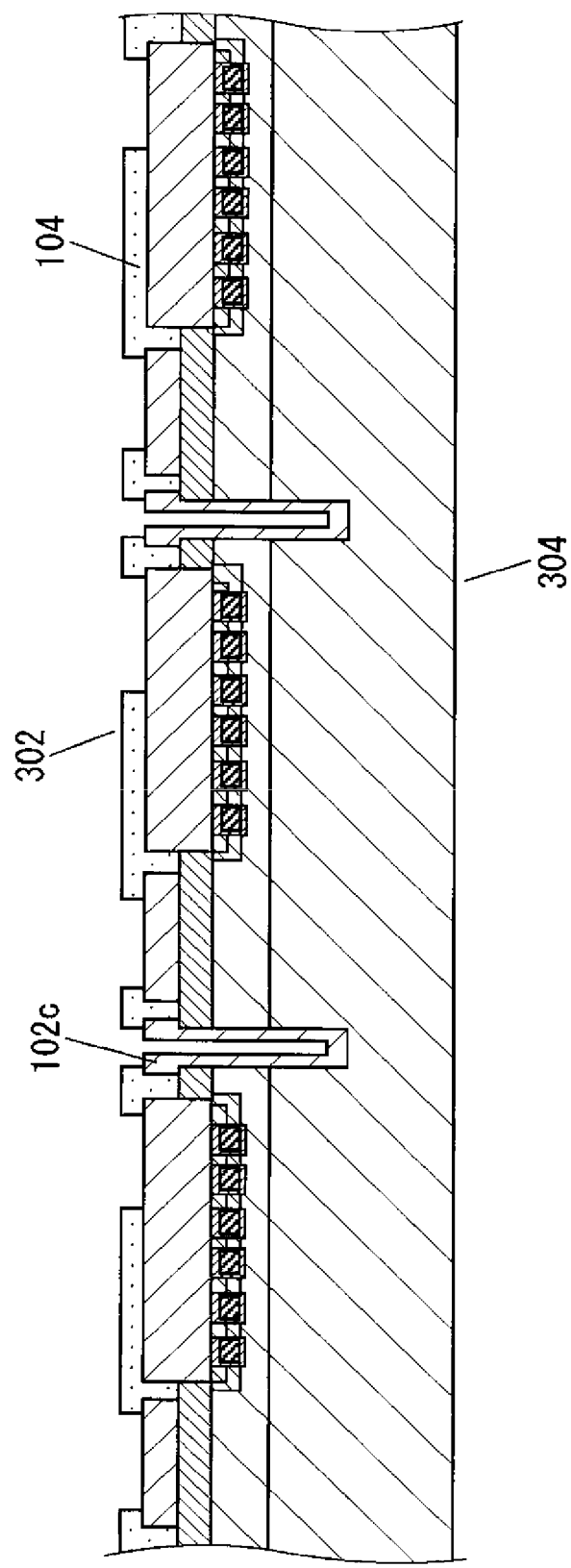
FIG. 3E is a cross-sectional view showing a step in the method for manufacturing the semiconductor device in the first exemplary embodiment.

Subsequently, as shown in FIG. 3E, protective film 104 is formed on upper surface 302.

Figure 3F:
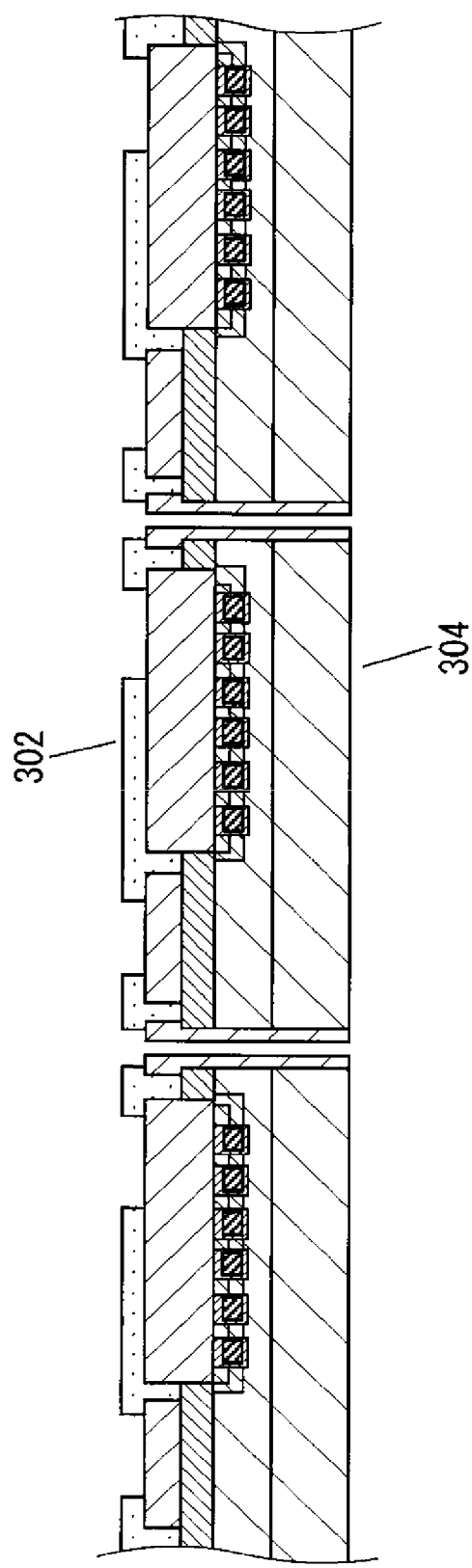
FIG. 3F is a cross-sectional view showing a step in the method for manufacturing the semiconductor device in the first exemplary embodiment.

Finally, as shown in FIG. 3F, lower surface 304 of wafer-like semiconductor substrate 300 is ground to reach groove 306, whereby the semiconductor device is completed. The grinding process may be performed by a method such as back grinding, polishing, wet etching, dray etching, or chemical mechanical polishing (CMP). The above methods may be combined.

Second Exemplary Embodiment

Hereinafter, a semiconductor device in the second exemplary embodiment in the present disclosure will be described with reference to FIGS. 4A to 4D.

Figure 4A:
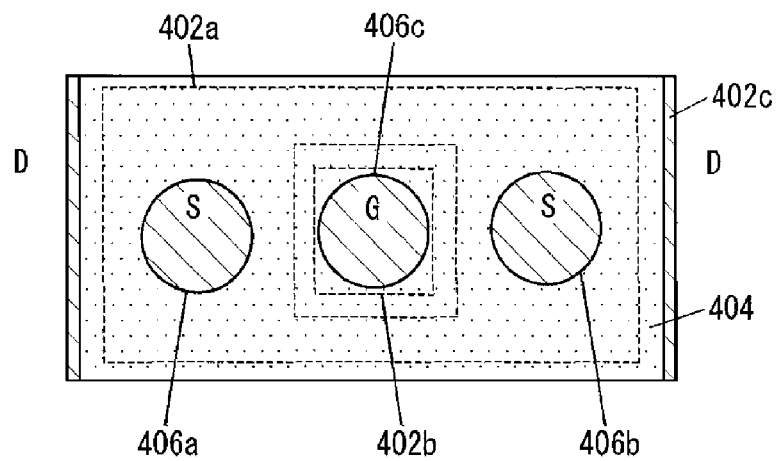
FIG. 4A is a plan view of a semiconductor device in a second exemplary embodiment.

FIG. 4A is a plan view of the semiconductor device in the second exemplary embodiment. A broken line shows conductor films 402a and 402b under protective film 404.

As shown in FIG. 4A, the semiconductor device includes conductor film 402a, conductor film 402b surrounded by conductor film 402a, and protective film 404 formed on the conductor films. Two openings 406a and 406b are provided in protective film 404 for conductor film 402a, while one opening 406c is provided in protective film 404 for conductor film 402b. Each of conductor film 402a, conductor film 402b, and conductor film 402c provided on each of opposite side surfaces of the semiconductor device serves as an external terminal.

Figure 4B:
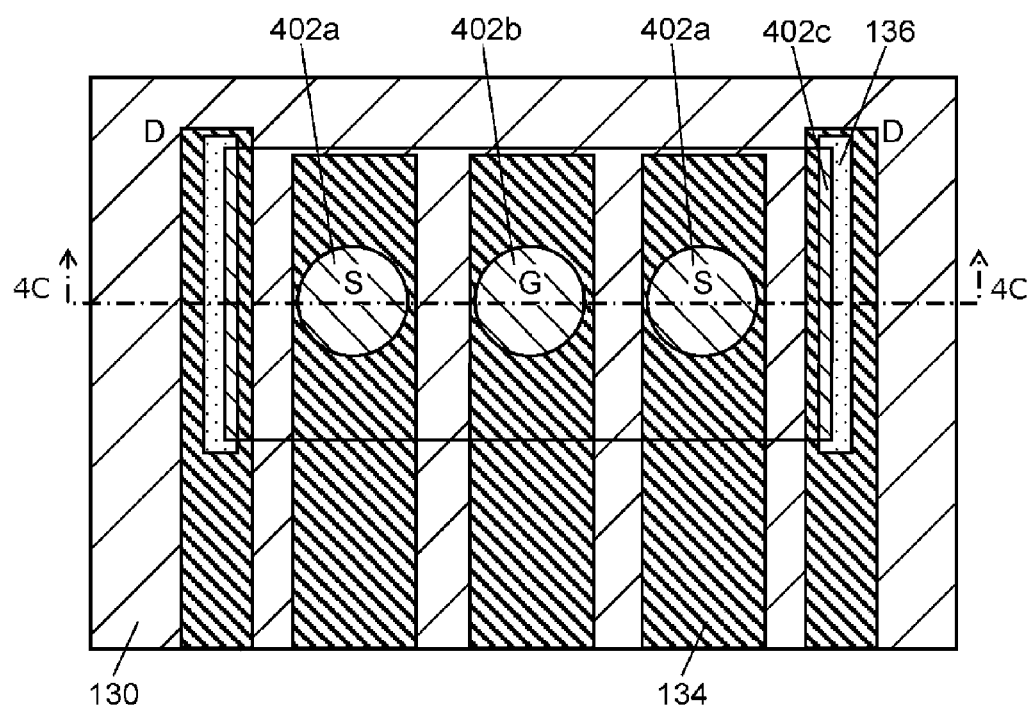
FIG. 4B is a plan view of the semiconductor device in the second exemplary embodiment mounted on a mounting substrate.
Figure 4C:
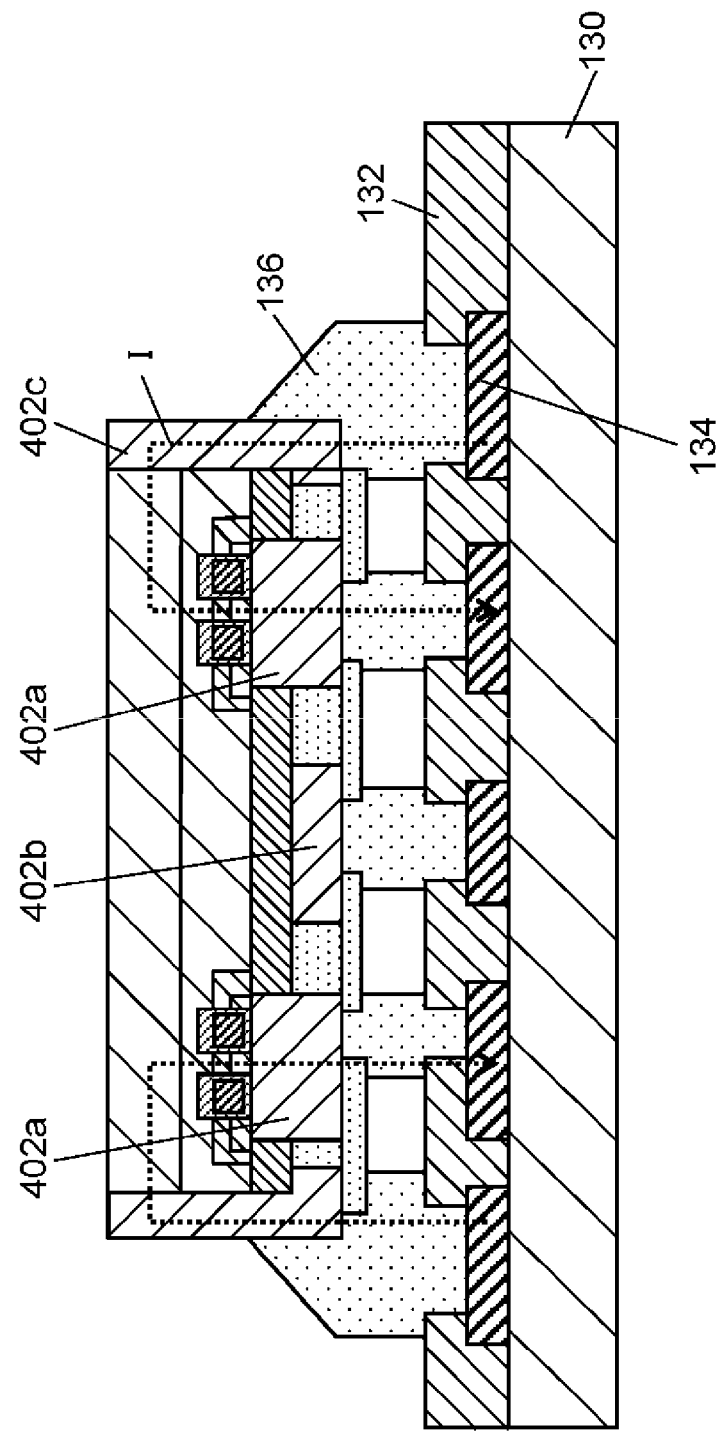
FIG. 4C is a cross-sectional view taken along line 4C-4C in FIG. 4B.

FIG. 4B is a plan view of the semiconductor device mounted on mounting substrate 130. FIG. 4B is a through-view of a portion other than the conductor film in the opening formed in protective film 404, and of substrate coating material 132 which will be described below. FIG. 4C is a cross-sectional view taken along line 4C-4C in FIG. 4B.

As shown in FIGS. 4B and 4C, each conductor film is connected to substrate pad 134 provided on mounting substrate 130 through connection material 136. Substrate pad 134 connected to conductor film 402a and conductor film 402b can be withdrawn through a region not covered with conductor film 402c. Substrate pad 134 serves as a wiring of mounting substrate 130.

In a case where the semiconductor element in the semiconductor device is a field effect transistor (FET), for example, conductor film 402a serves as a source electrode, conductor film 402b serves as a gate electrode, and conductor film 402c serves as a drain electrode. In a case where capacity between the gate and the drain is large, if an input is repeatedly switched between ON and OFF in the FET in a high-frequency switching operation, an output cannot be switched between ON and OFF with high follow ability.

However, according to this exemplary embodiment, conductor film 402a serving as the source electrode is disposed between conductor film 402b serving as the gate electrode and conductor film 402c serving as the drain electrode, so that the capacity between the gate and the drain can be small. This is because capacity between the gate and the source is connected in series with capacity between the source and the drain, so that the capacity between the gate and the drain becomes small when this is seen as an equivalent circuit. Thus, the semiconductor device can be superior in high-frequency driving.

Figure 4D:
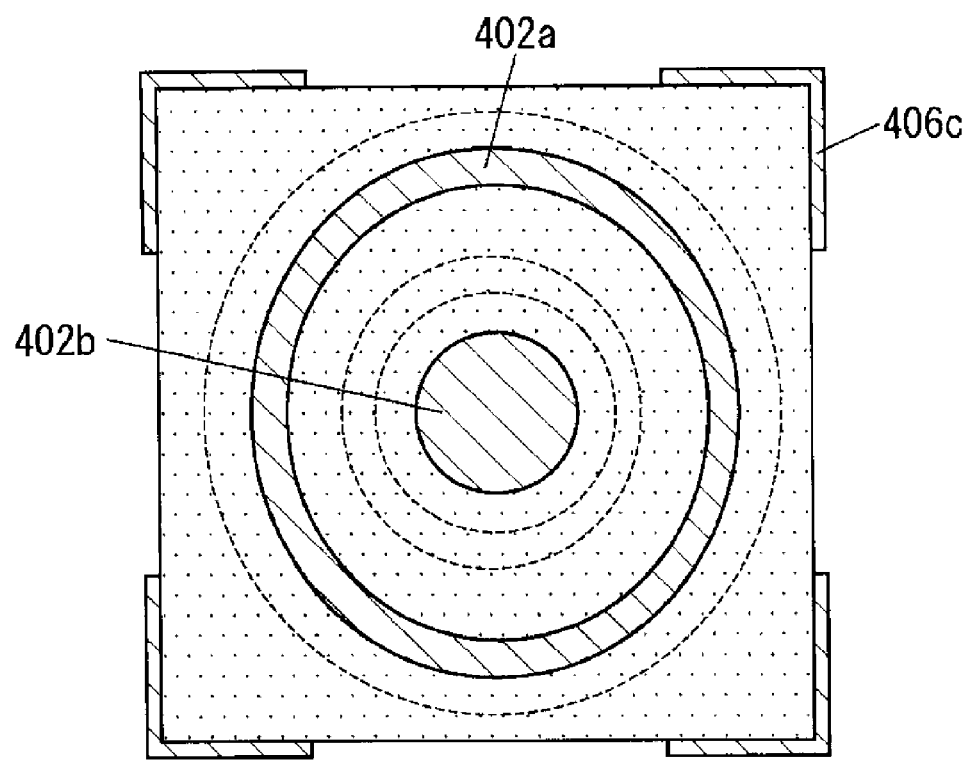
FIG. 4D is a plan view of a semiconductor device in a variation of the second exemplary embodiment.

FIG. 4D is a plan view of a semiconductor device in a variation of this exemplary embodiment.

As shown in FIG. 4D, conductor film 402b serving as a gate terminal may be circular in shape, and conductor film 402a serving as a source terminal may be formed into a donut shape surrounding conductor film 402b in a plan view. In this case, since conductor film 402a and conductor film 402b have the circular shape, the semiconductor device could rotate at the time of the face-down mounting. Thus, in order to prevent the semiconductor device from rotating, conductor film 402c is formed at four corners of the semiconductor device.

In addition, the semiconductor element may be another semiconductor element which can be driven at high speed such as bipolar transistor or IGBT. Furthermore, the source terminal is not always connected to the ground potential, and may be connected to a lowest potential supplied from an external circuit, in the semiconductor element.

Third Exemplary Embodiment

Figure 5A:
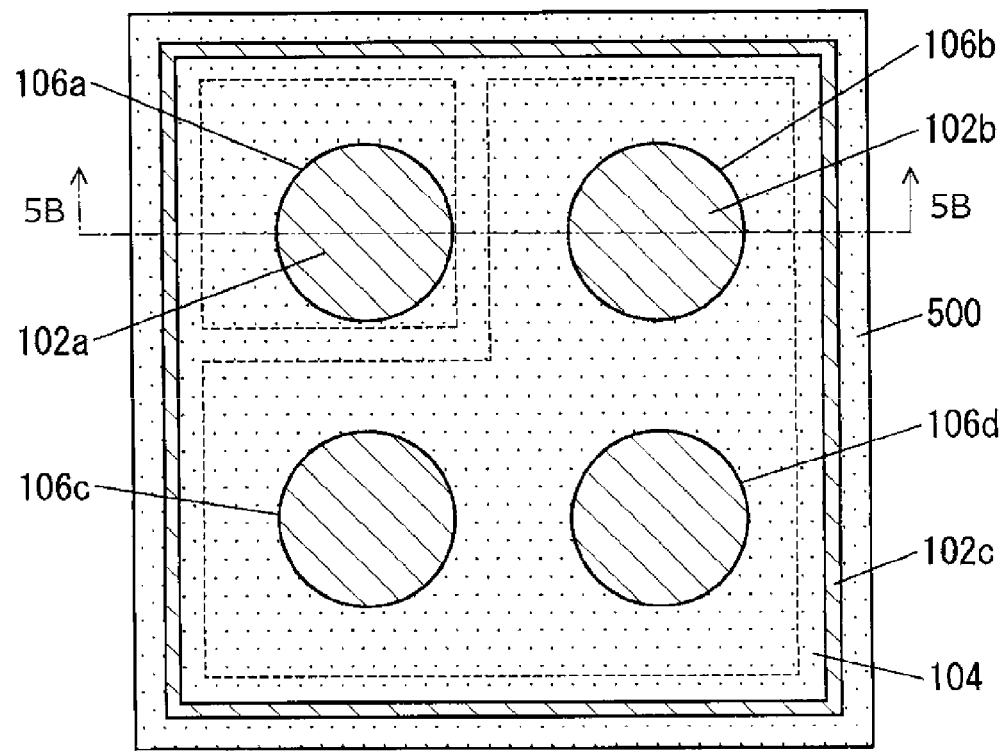
FIG. 5A is a plan view of a semiconductor device in a third exemplary embodiment.
Figure 5B:
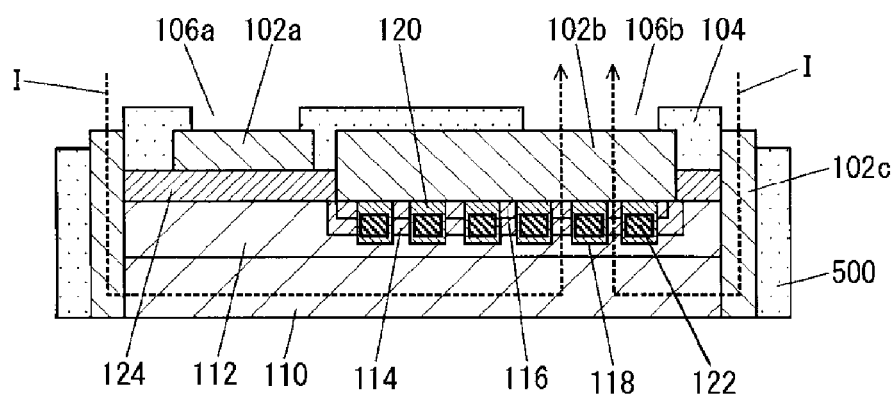
FIG. 5B is a cross-sectional view taken along line 5B-5B in FIG. 5A.

Hereinafter, a semiconductor device in the third exemplary embodiment in the present disclosure will be described with reference to FIGS. 5A and 5B. FIG. 5A is a plan view of the semiconductor device. FIG. 5B is a cross-sectional view of the semiconductor device taken along line 5B-5B in FIG. 5A.

Protective film 500 is formed on a side surface of the semiconductor device, that is, on conductor film 102c. Protective film 500 preferably has an insulating property. Protective film 500 is made of, for example, silicon oxide, silicon nitride, organic material, resin, silicone, metal oxide, or composed of composite material of the above materials, or may have laminated layers of the above materials. Protective film 500 may be formed by a CVD method.

In a manufacturing process of the semiconductor device including a mounting process, in order to reduce manufacturing costs by shortening a manufacturing time per semiconductor device, manufacturing speed is increased to maximum within a range tolerated by mechanical strength of the semiconductor device. However, in view of the mechanical strength of the semiconductor device, the manufacturing speed cannot be increased in some cases.

However, in this configuration, since conductor film 102c is covered with protective film 500, so that the semiconductor device has high mechanical strength. As a result, the manufacturing speed can be increased, so that a mass-productivity can be improved, and the low costs can be achieved.

Fourth Exemplary Embodiment

Figure 6A:
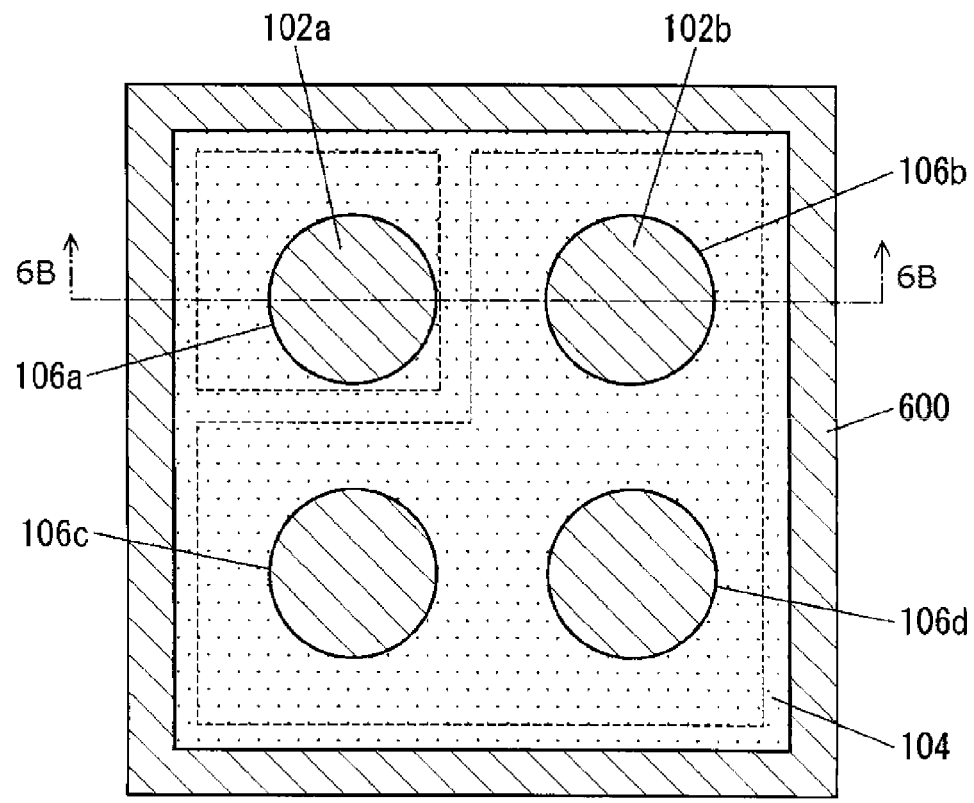
FIG. 6A is a plan view of a semiconductor device in a fourth exemplary embodiment.
Figure 6B:
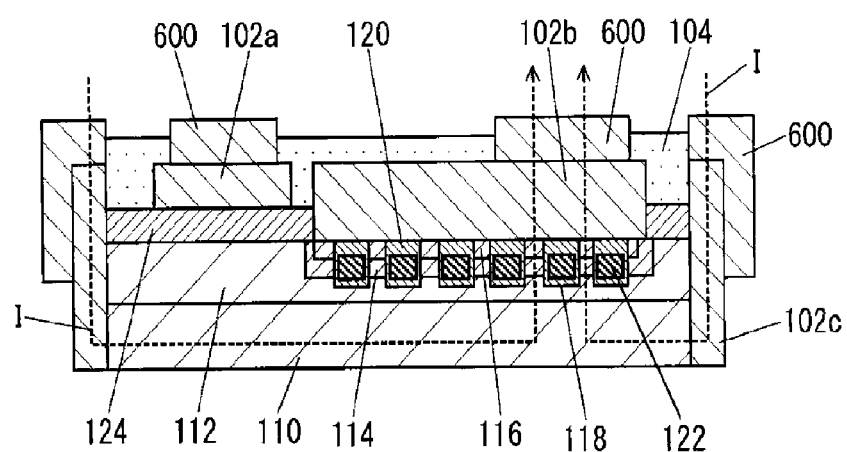
FIG. 6B is a cross-sectional view taken along line 6B-6B in FIG. 6A.
Figure 6C:
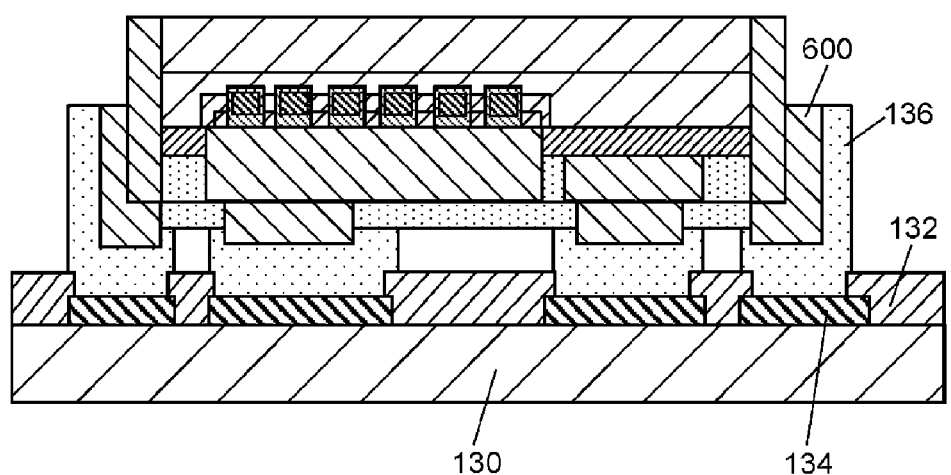
FIG. 6C is a plan view of the semiconductor device in the fourth exemplary embodiment mounted on a mounting substrate.

Hereinafter, a semiconductor device in the fourth exemplary embodiment in the present disclosure will be described with reference to FIGS. 6A and 6B. FIG. 6A is a plan view of the semiconductor device. FIG. 6B is a cross-sectional view of the semiconductor device taken along line 6B-6B in FIG. 6A. FIG. 6C is a cross-sectional view of the semiconductor device mounted on a mounting substrate taken along the same position as line 6B-6B in FIG. 6A.

As shown in FIGS. 6A and 6B, conductor film 600 covers a part of conductor films 102a and 102b exposed at openings 106a, 106b, 106c and 106d formed in protective film 104, and an upper surface and a part of a side surface of conductor film 102c. The side surface of conductor film 102c may be totally covered with conductor film 600.

According to the method for manufacturing the semiconductor device in this exemplary embodiment, after conductor film 102c is formed in groove 306 as shown in FIG. 3C, a whole upper surface 302 of wafer-like semiconductor substrate 300 is subjected to electroless plating. Through this electroless plating, conductor film 600 can be formed to have better wettability to connection material 136 that conductor film 102c.

In this configuration, connection material 136 can be likely to extend upward along conductor film 102c, so that a bonding area is increased, and bonding strength can be improved.

Furthermore, a thickness of conductor film 600 can be appropriately changed by adjusting a concentration of an electroless plating solution, or stirring speed of the plating solution during the plating operation. Conductor film 102c and conductor film 600 may be made of different materials. In addition, when conductor film 102c is made of Al, conductor film 102c has a poor wettability to a SnAg solder which is a kind of Sn-containing connection material. In this case, electroless plating is performed with Ni or Au which has a good wettability to the SnAg solder. However, the material of conductor film 600 is not limited to Ni or Au.

Fifth Exemplary Embodiment

Hereinafter, a semiconductor device in the fifth exemplary embodiment of the present disclosure will be described with reference to FIGS. 7A and 7B.

Figure 7A:
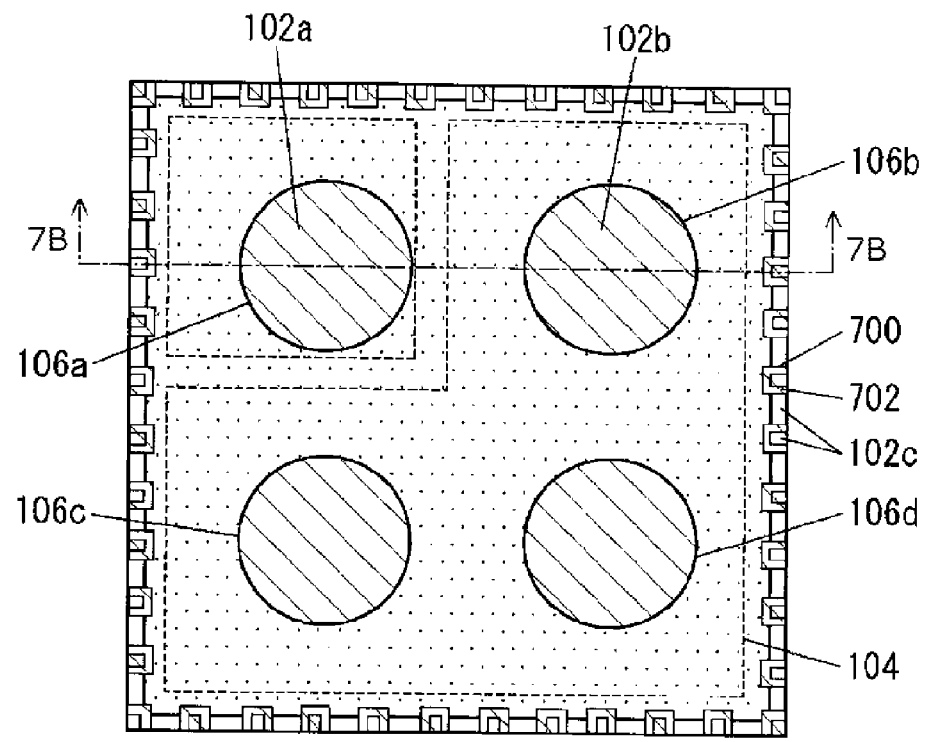
FIG. 7A is a plan view of a semiconductor device in a fifth exemplary embodiment.

FIG. 7A is a plan view of the semiconductor device. As shown in FIG. 7A, a plurality of grooves 700 are formed at intervals along an outer periphery of an upper surface of the semiconductor device. Conductor film 702 is formed in groove 700.

Figure 7B:
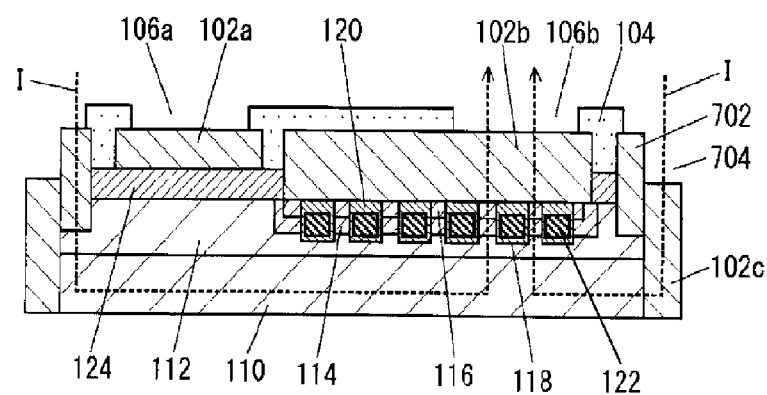
FIG. 7B is a cross-sectional view taken along line 7B-7B in FIG. 7A.

FIG. 7B is a cross-sectional view of the semiconductor device taken along line 7B-7B in FIG. 7A. As shown in FIG. 7B, an upper surface of conductor film 702 is flush with upper surfaces of conductor film 102a and 102b. A height of an upper surface of conductor film 102c is smaller than a height of the upper surface of conductor film 702, based on a lower surface of the semiconductor device, so that level difference 704 is formed between conductor film 102c and conductor film 702.

In this structure, compared with the semiconductor device in the first exemplary embodiment in which the connection material only contacts with conductor film 102c on the side surface of the semiconductor device, the connection material largely contacts with conductor film 102c and conductor film 702, so that bonding strength with the mounting substrate is further increased.

The method for manufacturing the semiconductor device in this exemplary embodiment is provided by adding the following step to the manufacturing method in the first exemplary embodiment. For example, in the process for forming the semiconductor element, plurality of grooves 700 are formed so as to be disposed apart from each other in semiconductor layer 112. Conductor film 702 is formed in groove 700 when conductor films 102a and 102b are formed. After that, almost the same process as the manufacturing method in the first exemplary embodiment is performed, whereby the semiconductor device is completed.

In addition, a depth of groove 700 from the upper surface of semiconductor layer 112, a width of groove 700 in a side surface direction, and the number of grooves 700 may be optionally selected to the extent that an operation of the semiconductor element is not adversely affected. Furthermore, groove 700 may be formed to reach semiconductor layer 110.

Sixth Exemplary Embodiment

Figure 8A:
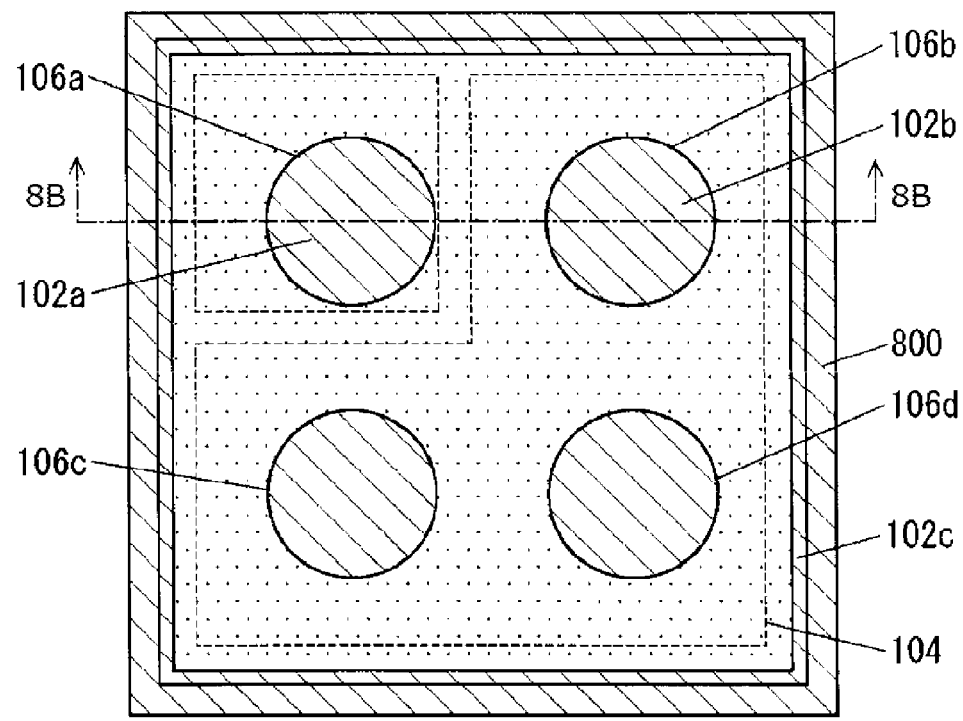
FIG. 8A is a plan view of a semiconductor device in a sixth exemplary embodiment.
Figure 8B:
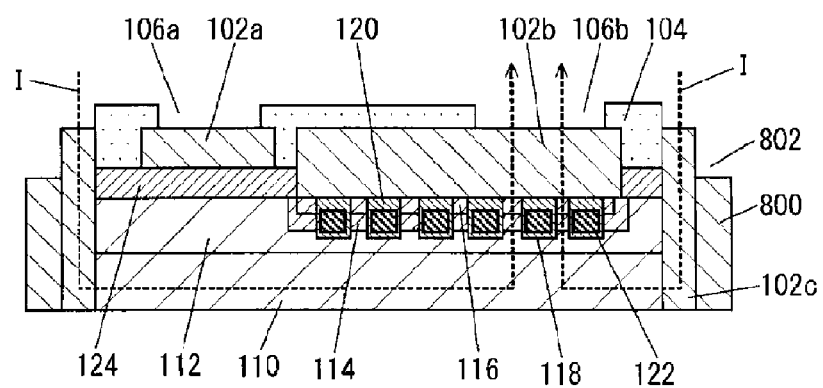
FIG. 8B is a cross-sectional view taken along line 8B-8B in FIG. 8A.

Hereinafter, a semiconductor device in the sixth exemplary embodiment of the present disclosure will be described with reference to FIGS. 8A and 8B. FIG. 8A is a plan view of the semiconductor device. FIG. 8B is a cross-sectional view of the semiconductor device taken along line 8B-8B in FIG. 8A.

As shown in FIG. 8A, conductor film 800 serves as a side surface of the semiconductor device. As shown in FIG. 8B, a height of an upper surface of conductor film 800 is smaller than a height of an upper surface of conductor film 102c, based on a lower surface of the semiconductor device, so that level difference 802 is formed between conductor film 102c and conductor film 800.

In this structure, compared with the semiconductor device in the first exemplary embodiment in which the connection material only contacts with conductor film 102c on the side surface of the semiconductor device, a connection material largely contacts with conductor film 102c and conductor film 800, so that bonding strength with the mounting substrate is further increased.

The method for manufacturing the semiconductor device in this exemplary embodiment is provided by adding the following step to the manufacturing method in the first exemplary embodiment. For example, under the condition that upper surface 302 of the singulated semiconductor device is held, only lower surface 304 is soaked in an electroless plating bath, and a plated film is ground, whereby the semiconductor device is completed.

Seventh Exemplary Embodiment

Figure 9A:
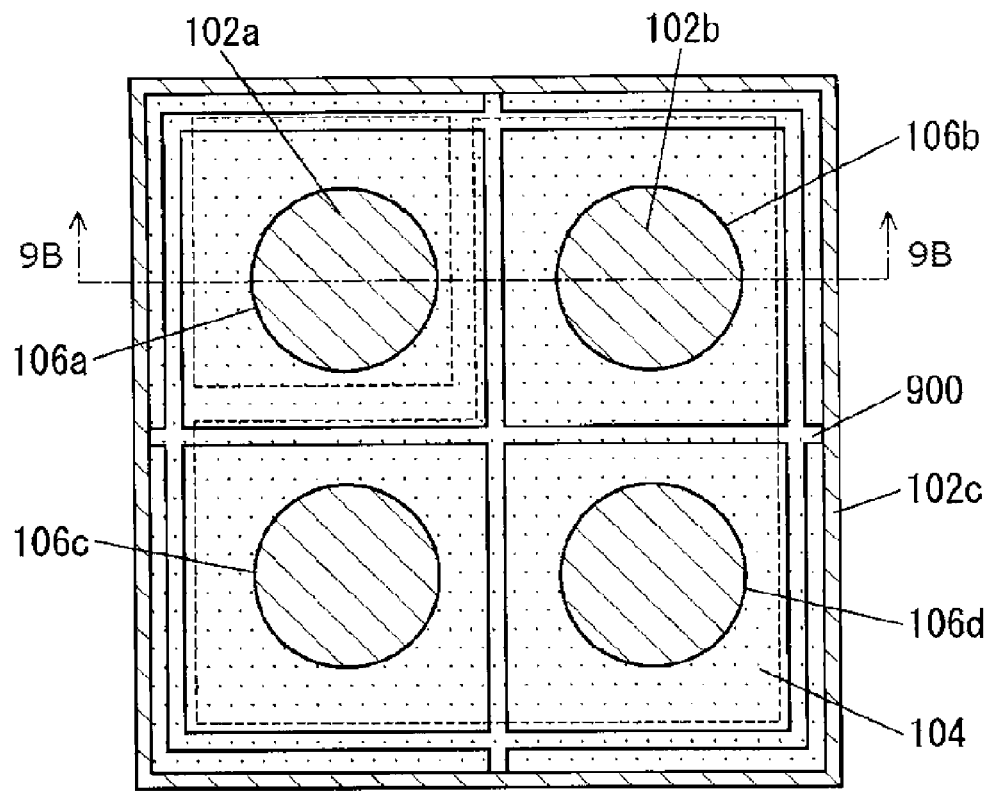
FIG. 9A is a plan view of a semiconductor device in a seventh exemplary embodiment.
Figure 9B:
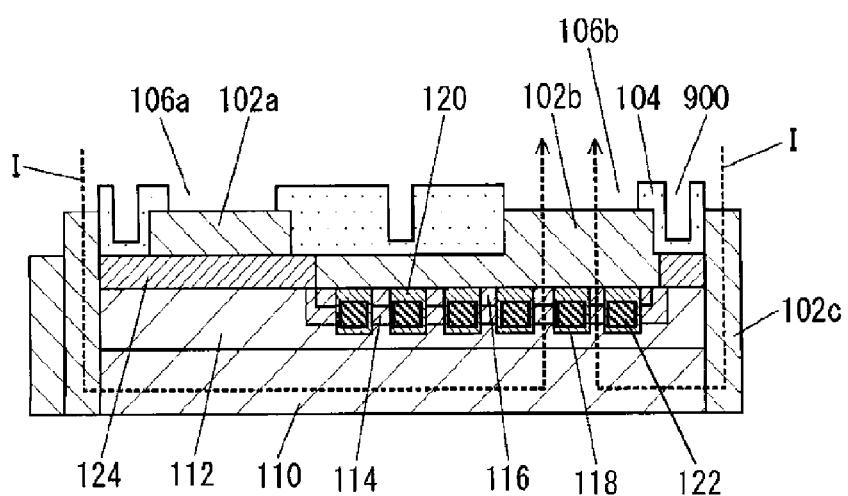
FIG. 9B is a cross-sectional view taken along line 9B-9B in FIG. 9A.

Hereinafter, a semiconductor device in the seventh exemplary embodiment of the present disclosure will be described with reference to FIGS. 9A to 9C. FIG. 9A is a plan view of the semiconductor device. FIG. 9B is a cross-sectional view of the semiconductor device taken along line 9B-9B in FIG. 9A. As shown in FIG. 9A, groove 900 is formed in an upper surface of protective film 104. Groove 900 is formed between conductor films. As shown in FIG. 9B, groove 900 is formed not to penetrate protective film 104. In addition, groove 900 may be formed to penetrate protective film 104 so that conductor film 102b and insulating film 124 are exposed.

Figure 9C:
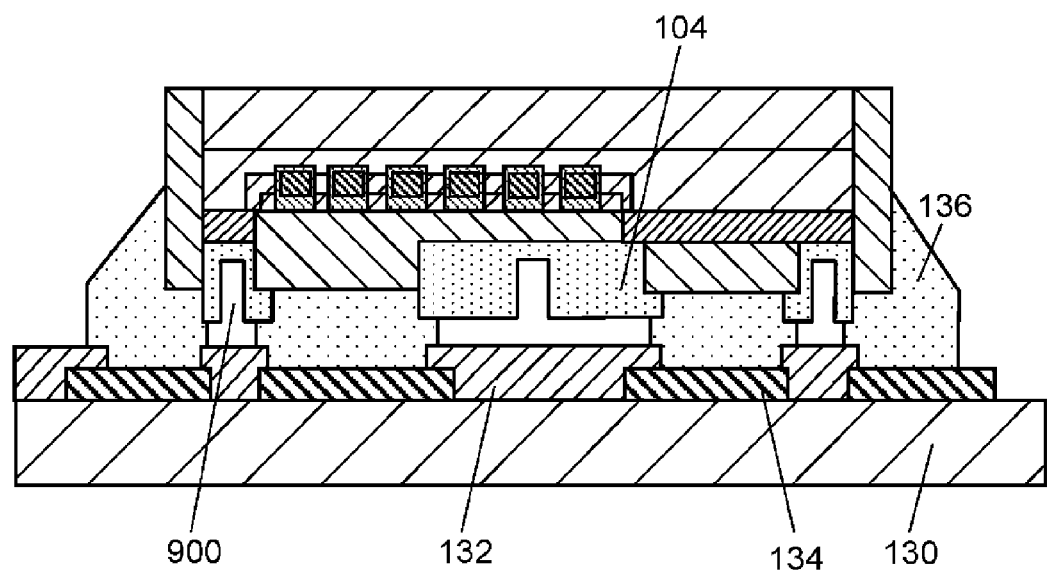
FIG. 9C is a plan view of the semiconductor device in the seventh exemplary embodiment mounted on a mounting substrate.

FIG. 9C is a cross-sectional view of the semiconductor device mounted on a mounting substrate taken along the same position as line 9B-9B in FIG. 9A. In a reflowing process to mount the semiconductor device on the mounting substrate, a capillary phenomenon occurs in a space between the semiconductor device and the mounting substrate. Thus, when a distance between the conductor films is reduced as the semiconductor device is miniaturized, melted connection materials 136 are connected to each other due to the capillary phenomenon in some cases.

However, according to this exemplary embodiment, protective film 104 has groove 900. In this structure, as shown in FIG. 9C, groove 900 can prevent connection materials 136 from being connected to each other due to the capillary phenomenon.

As a result, the distance between the conductor films can be reduced, so that the semiconductor device can be miniaturized.

The method for manufacturing the semiconductor device in this exemplary embodiment is provided by adding the following step to the manufacturing method in the first exemplary embodiment. For example, after protective film 104 has been formed, groove 900 is formed between the conductor films in the upper surface of protective film 104 by etching.

In addition, instead of forming groove 900 in protective film 104, a groove may be formed in substrate coating material 132, or grooves may be formed in both of protective film 104 and substrate coating material 132.

Eighth Exemplary Embodiment

Figure 10A:
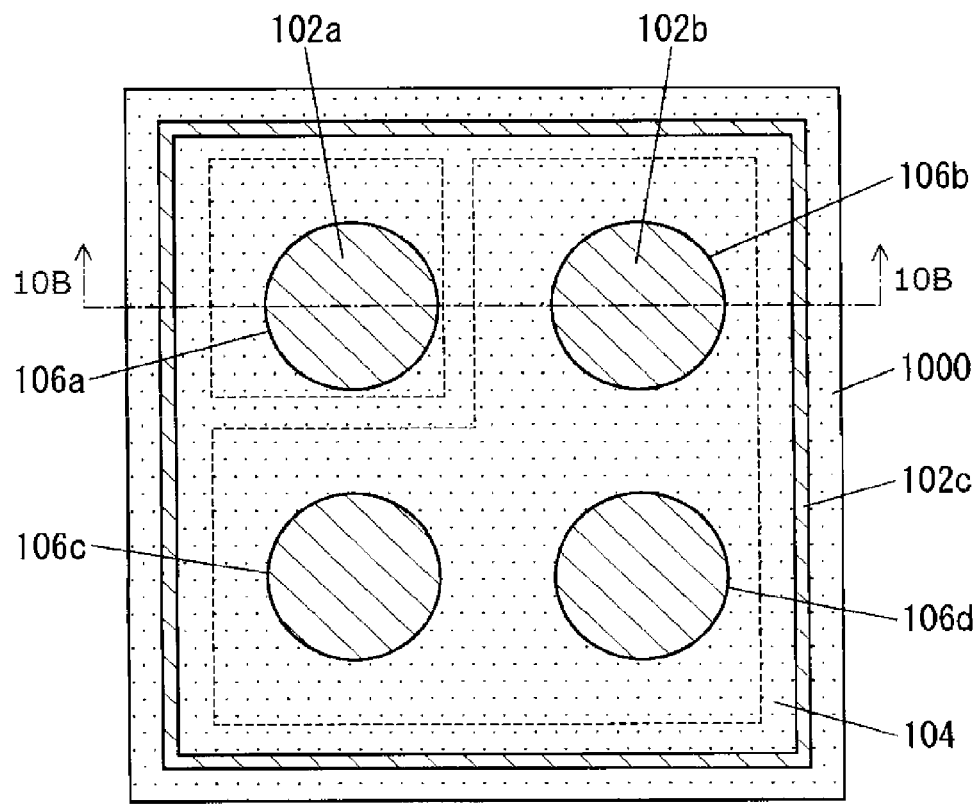
FIG. 10A is a plan view of a semiconductor device in an eighth exemplary embodiment.
Figure 10B:
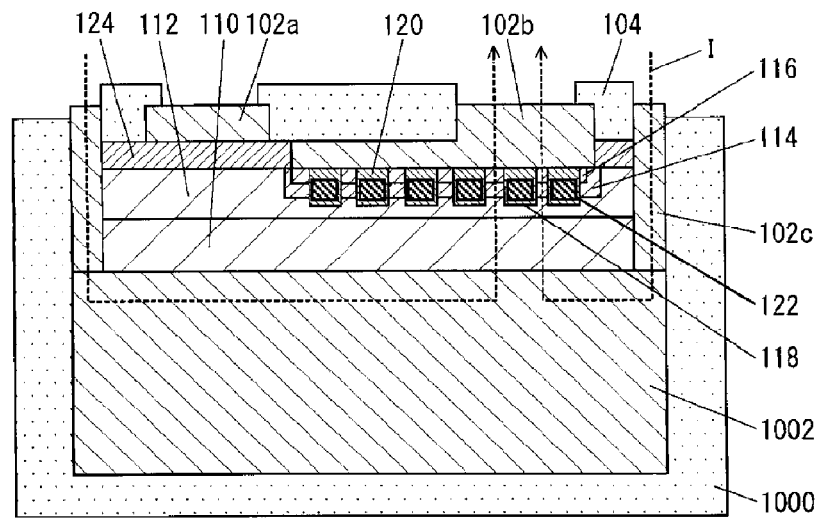
FIG. 10B is a cross-sectional view taken along line 10B-10B in FIG. 10A.
Figure 10C:
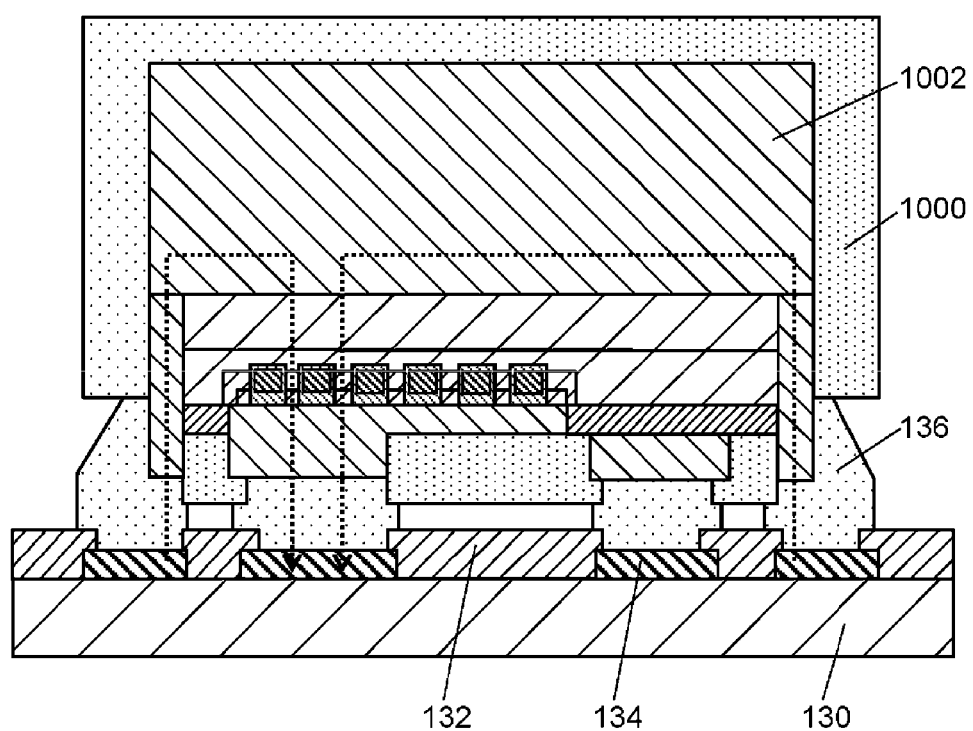
FIG. 10C is a plan view of the semiconductor device in the eighth exemplary embodiment mounted on a mounting substrate.

Hereinafter, a semiconductor device in the eighth exemplary embodiment of the present disclosure will be described with reference to FIGS. 10A to 10C. FIG. 10A is a plan view of the semiconductor device in the eighth exemplary embodiment. FIG. 10B is a cross-sectional view of the semiconductor device taken along line 10B-10B in FIG. 10A. FIG. 10C is a cross-sectional view of the semiconductor device mounted on a mounting substrate taken along the same position as line 10B-10B in FIG. 10A.

As shown in FIG. 10A, a side surface of the semiconductor device is covered with protective film 1000. As shown in FIG. 10B, the semiconductor device further includes conductor film 1002 formed on a lower surface of semiconductor layer 110 and electrically connected to conductor film 102c. A side surface of conductor film 102c and a side surface and a lower surface of conductor film 1002 are covered with protective film 1000.

A resistance component generated due to sheet resistance of semiconductor layer 110 becomes dominant with respect to a total resistance component in the semiconductor device in some cases. However, in this structure, due to conductor film 1002, the resistance component can be reduced. In addition, as the thickness of conductor film 1002 is increased, electric resistance can be reduced. For example, the thickness of conductor film 1002 is preferably 3 μm or more, and its upper value is not limited in particular to the extent that the mounting is not affected. Furthermore, in this structure, in addition to the reduction in electric resistance, mechanical strength is increased in the semiconductor device, so that the manufacturing process including the mounting process of the semiconductor device can be easy to perform.

Since conductor film 102c and conductor film 1002 are covered with protective film 1000, the mechanical strength is high in the semiconductor device. Furthermore, protective film 1000 preferably has an insulating property. For example, it is preferably made of silicon oxide, silicon nitride, organic material, resin, silicone, metal oxide, or composite material of the above materials, or may have a laminated-layer structure composed of the above materials. Furthermore, in a case where conductor film 102b and conductor film 1002 have the same thickness, and protective film 104 and protective film 1000 formed on the lower surface of conductor film 1002 have the same thickness, an internal stress of the semiconductor device can be reduced, so that even when the semiconductor layer is thinned, the semiconductor device is not likely to warp, and is easy to handle.

The method for manufacturing the semiconductor device in this exemplary embodiment is provided by adding the following step to the manufacturing method in the first exemplary embodiment. For example, after the lower surface of semiconductor layer 110 has been ground, conductor film 1002 is formed by sputtering or vapor deposition. After that, protective film 1000 is formed on the side surface of conductor film 102c and the side surface and the lower surface of conductor film 1002, whereby the semiconductor device is completed.

Ninth Exemplary Embodiment

Figure 11A:
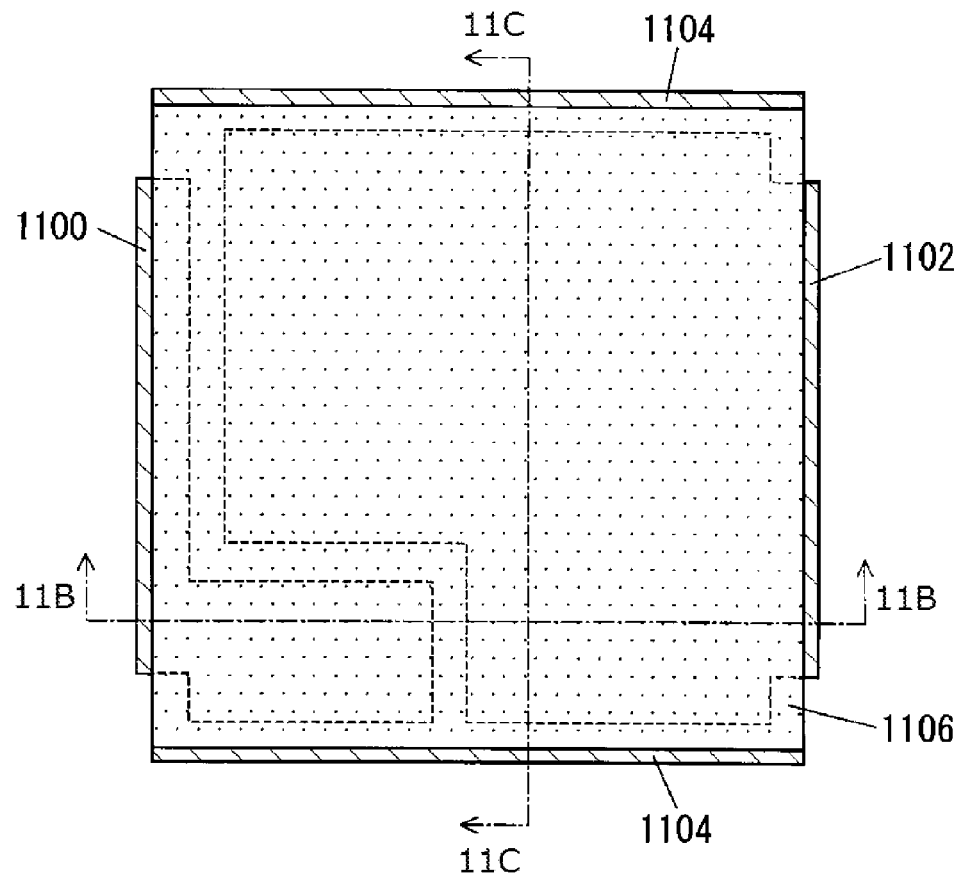
FIG. 11A is a plan view of a semiconductor device in a ninth exemplary embodiment.
Figure 11B:
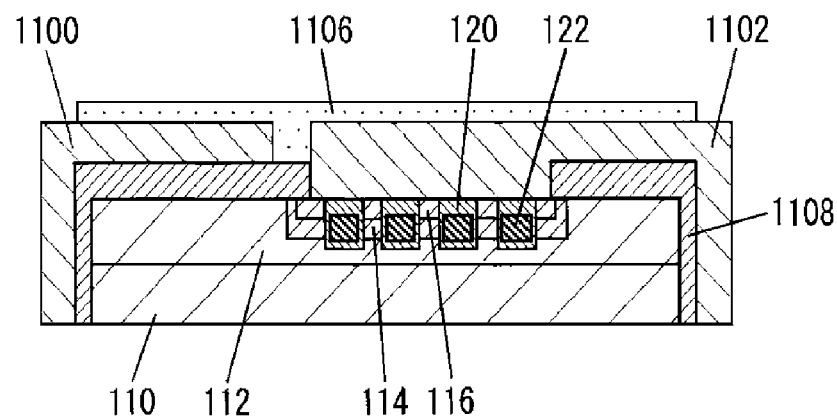
FIG. 11B is a cross-sectional view taken along line 11B-11B in FIG. 11A.
Figure 11C:
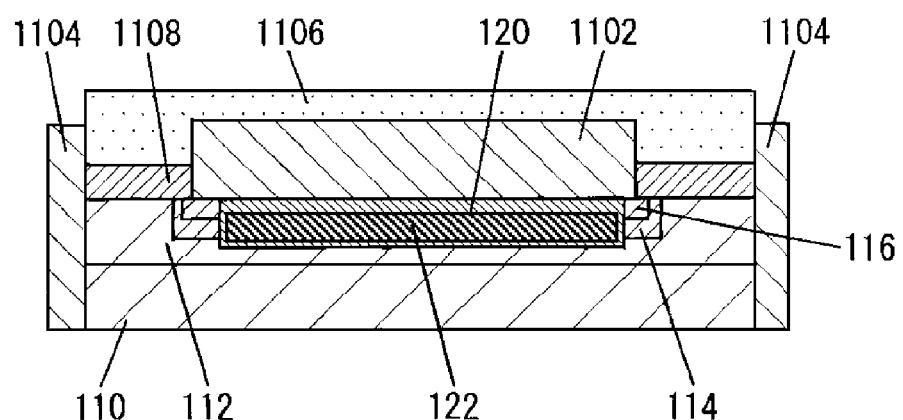
FIG. 11C is a cross-sectional view taken along line 11C-11C in FIG. 11A.

Hereinafter, a semiconductor device in the ninth exemplary embodiment of the present disclosure will be described with reference to FIGS. 11A and 11B. FIG. 11A is a plan view of the semiconductor device. FIG. 11B is a cross-sectional view of the semiconductor device taken along line 11B-11B in FIG. 11A. FIG. 11C is a cross-sectional view of the semiconductor device taken along line 11C-11C in FIG. 11A.

As shown in FIG. 11A, the semiconductor device includes conductor films 1100 and 1102 each formed on an upper surface and a side surface of the semiconductor device, conductor film 1104 formed on other side surfaces of the semiconductor device, and protective film 1106 for covering conductor films 1100 and 1102 on the upper surface of the semiconductor device. Conductor films 1100 and 1102 are disposed on insulating film 1108. Conductor film 1100 serves as a gate electrode, conductor film 1102 serves as a source electrode, and conductor film 1104 serves as a drain electrode. As shown in FIG. 11B, each of conductor film 1100 and conductor film 1102 covers the upper surface and the side surface of the semiconductor device and is formed integrally.

In a case where the semiconductor devices in the first to eighth exemplary embodiments are miniaturized, an area of conductor film 102b serving as the source electrode is reduced in the upper surface of the device, which causes an increase in ON-resistance.

However, according to this exemplary embodiment, since conductor film 1102 serving as the source electrode is also disposed on the side surface of the semiconductor layer, so that its area can be ensured. As a result, while the ON-resistance is prevented from being increased, the semiconductor device can be miniaturized.

As described above, the first to ninth exemplary embodiments and their variations have been described as the examples of the technique disclosed in this specification. However, the technique of the present disclosure is not limited to the above and can be applied to an exemplary embodiment in which change, replacement, addition, or omission is performed. Furthermore, a new exemplary embodiment can be provided by combining the components described in the first to ninth exemplary embodiments and their variations.

In the exemplary embodiments disclosed in this specification, the semiconductor layer is made of a material having a property of semiconductor such as Si, SiC, GaAs, or GaN.

Furthermore, the effect of the present disclosure can be attained in the above configuration regardless of the polarity of the semiconductor layer. Furthermore, the semiconductor device has the cubic shape in the above embodiments, but the effect of the present disclosure can be attained even when the semiconductor device has a cylindrical shape, a polygonal column shape such as triangular column or hexagonal column, or a polygonal pyramid such as triangular pyramid or hexagonal pyramid.

Furthermore, the above exemplary embodiments are provided only to embody the technique of the present disclosure, so that various change, replacement, addition, and omission can be allowed within the scope of the claims and its equivalent scope.

What is claimed is:

1. A face-down mounting type semiconductor device having a vertical type semiconductor element formed inside the face-down mounting type semiconductor device, the vertical type semiconductor element being configured to make a current flow between an upper surface terminal formed at an upper surface of the face-down mounting type semiconductor device and a lower surface terminal formed at a lower surface of the face-down mounting type semiconductor device which is opposite to the upper surface, the face-down mounting type semiconductor device comprising:
a semiconductor layer in which the vertical type semiconductor element is formed inside the semiconductor layer;
a first conductor film formed in direct contact with an upper surface of the semiconductor layer and constituting the upper surface terminal;
a second conductor film formed in direct contact with the semiconductor layer continuously between a position of a lower surface of the semiconductor layer and a position of the upper surface of the semiconductor layer at a side surface of the face-down mounting type semiconductor device and electrically connected to the lower surface terminal, the lower surface terminal being formed on the lower surface of the semiconductor layer; and
a first protective film formed on the first conductor film and having one or more openings to expose the first conductor film,
wherein:
both the first conductor film and the second conductor film are surface mounting terminals, and
a height from the upper surface of the semiconductor layer to an upper surface of the second conductor film is equal to or smaller than a height from the upper surface of the semiconductor layer to an upper surface of the first conductor film.

2. The face-down mounting type semiconductor device according to claim 1, wherein:
the openings include a first opening and a second opening, and
an area of the first opening is equal to an area of the second opening.

3. The face-down mounting type semiconductor device according to claim 2, wherein a perimeter of the first opening is equal to a perimeter of the second opening.

4. The face-down mounting type semiconductor device according to claim 1, wherein:
the openings include a first opening and a second opening, and
a perimeter of the first opening is equal to a perimeter of the second opening.

5. The face-down mounting type semiconductor device according to claim 1, wherein the second conductor film has a plurality of recesses disposed apart from each other.

6. The face-down mounting type semiconductor device according to claim 1, further comprising a third conductor film formed on the second conductor film, wherein
a level difference is formed between the second conductor film and the third conductor film.

7. The face-down mounting type semiconductor device according to claim 6, wherein the third conductor film has a better wettability than the second conductor film, with respect to a connection material for connecting the face-down mounting type semiconductor device to a mounting substrate.

8. The face-down mounting type semiconductor device according to claim 1, wherein:
the side surface of the face-down mounting type semiconductor device includes a first side surface and a second side surface opposite to the first side surface, and
the second conductor film is formed on the first side surface and the second side surface.

9. The face-down mounting type semiconductor device according to claim 1, wherein:
the second conductor film is partially formed on the side surface, and
the side surface of the face-down mounting type semiconductor device has a region without the second conductor film being disposed.

10. The face-down mounting type semiconductor device according to claim 1, wherein:
the vertical type semiconductor element is a field effect transistor,
the semiconductor device further comprises a fourth conductor film formed on the upper surface of the semiconductor layer and electrically connected to the vertical type semiconductor element,
the first conductor film serves as a source electrode, the second conductor film serves as a drain electrode, and the fourth conductor film serves as a gate electrode, and
the first conductor film is disposed between the second conductor film and the fourth conductor film in a planar view.

11. The face-down mounting type semiconductor device according to claim 10, wherein the first conductor film surrounds the fourth conductor film in a planar view.

12. The face-down mounting type semiconductor device according to claim 1, further comprising a contact region formed between the semiconductor layer and the second conductor film and having lower resistance than the semiconductor layer.

13. The face-down mounting type semiconductor device according to claim 1, wherein the first protective film has a groove.

14. The face-down mounting type semiconductor device according to claim 1, wherein the first conductor film is also disposed at the side surface of the face-down mounting type semiconductor device.

15. The face-down mounting type semiconductor device according to claim 1, wherein the upper surface of the first conductor film is flush with the upper surface of the second conductor film.

16. The face-down mounting type semiconductor device according to claim 1, further comprising a fifth conductor film formed in direct contact with the lower surface terminal and electrically connected to the second conductor film.

17. The face-down mounting type semiconductor device according to claim 16, further comprising a second protective film for covering a lower surface of the fifth conductor film.

18. The face-down mounting type semiconductor device according to claim 17, wherein:
- a thickness of the first conductor film is equal to a thickness of the fifth conductor film, and
- a thickness of the first protective film is equal to a thickness of the second protective film.

19. The face-down mounting type semiconductor device according to claim 1, further comprising a third protective film for covering the second conductor film.

20. The face-down mounting type semiconductor device according to claim 1, wherein:
- the second conductor film covers an intersection of the upper surface of the face-down mounting type semiconductor device and the side surface of the face-down mounting type semiconductor device, and
- an end of the second conductor film at the upper surface of the face-down mounting type semiconductor device is covered with the first protective film.

\* \* \* \* \*